United States Patent
Jang et al.

(10) Patent No.: US 9,312,270 B2
(45) Date of Patent: Apr. 12, 2016

(54) METHODS OF MANUFACTURING THREE-DIMENSIONAL SEMICONDUCTOR MEMORY DEVICES

(71) Applicant: Samsung Electronics Co., Ltd., Suwon-si (KR)

(72) Inventors: Kyung-Tae Jang, Seoul (KR); Myoungbum Lee, Hwasung (KR); Seungmok Shin, Yongin-si (KR); JinGyun Kim, Yongin-si (KR); Yeon-Sil Sohn, Seongnam-si (KR); Seung-Yup Lee, Seongnam-si (KR); Dae-Hun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/593,221

(22) Filed: Jan. 9, 2015

(65) Prior Publication Data

US 2015/0126007 A1     May 7, 2015

Related U.S. Application Data

(62) Division of application No. 13/230,447, filed on Sep. 12, 2011.

(30) Foreign Application Priority Data

Sep. 14, 2010   (KR) .................. 10-2010-0090186
Oct. 21, 2010   (KR) .................. 10-2010-0103017

(51) Int. Cl.
*H01L 21/00*     (2006.01)
*H01L 27/115*     (2006.01)
*H01L 21/28*     (2006.01)
(Continued)

(52) U.S. Cl.
CPC ...... *H01L 27/11582* (2013.01); *H01L 21/0217* (2013.01); *H01L 21/02164* (2013.01); *H01L 21/02271* (2013.01); *H01L 21/28273* (2013.01); *H01L 21/28282* (2013.01); *H01L 21/31111* (2013.01); *H01L 27/11551* (2013.01); *H01L 27/11556* (2013.01); *H01L 27/11565* (2013.01); *H01L 27/11578* (2013.01)

(58) Field of Classification Search
CPC ......................... H01L 29/7827; H01L 27/115
See application file for complete search history.

(56) References Cited

U.S. PATENT DOCUMENTS

| | | | |
|---|---|---|---|
| 5,356,722 A | 10/1994 | Nguyen et al. | |
| 6,319,849 B1 | 11/2001 | Oda et al. | |
| 6,677,213 B1 * | 1/2004 | Ramkumar et al. | 438/308 |

(Continued)

FOREIGN PATENT DOCUMENTS

| | | |
|---|---|---|
| JP | 06-291039 | 10/1994 |
| JP | 10-092810 | 4/1998 |

(Continued)

*Primary Examiner* — Zandra Smith
*Assistant Examiner* — Andre' C Stevenson
(74) *Attorney, Agent, or Firm* — Myers Bigel & Sibley

(57) ABSTRACT

Methods of manufacturing a three-dimensional semiconductor device are provided. The method includes: forming a thin film structure, where first and second material layers of at least 2n (n is an integer more than 2) are alternately and repeatedly stacked, on a substrate; wherein the first material layer applies a stress in a range of about $0.1 \times 10^9$ dyne/cm$^2$ to about $10 \times 10^9$ dyne/cm$^2$ to the substrate and the second material layer applies a stress in a range of about $-0.1 \times 10^9$ dyne/cm$^2$ to about $-10 \times 10^9$ dyne/cm$^2$ to the substrate.

20 Claims, 21 Drawing Sheets

(51) Int. Cl.
*H01L 21/02* (2006.01)
*H01L 21/311* (2006.01)

(56) References Cited

U.S. PATENT DOCUMENTS

| | | | |
|---|---|---|---|
| 7,351,622 B2 * | 4/2008 | Buh | H01L 29/42392 438/157 |
| 8,338,224 B2 | 12/2012 | Yoon et al. | |
| 2002/0151175 A1 | 10/2002 | Shioya et al. | |
| 2008/0217663 A1 | 9/2008 | Doris et al. | |
| 2010/0213527 A1 * | 8/2010 | Shim et al. | 257/314 |
| 2010/0301428 A1 * | 12/2010 | Forbes et al. | 257/410 |

FOREIGN PATENT DOCUMENTS

| | | |
|---|---|---|
| JP | 3083934 B2 | 9/2000 |
| JP | 2002-305242 | 10/2002 |
| JP | 2009-224612 | 10/2009 |
| KR | 1020000041423 A | 7/2000 |
| KR | 1020020079412 A | 10/2002 |
| KR | 100759087 B1 | 9/2007 |

\* cited by examiner

US 9,312,270 B2

METHODS OF MANUFACTURING THREE-DIMENSIONAL SEMICONDUCTOR MEMORY DEVICES

CLAIM OF PRIORITY

This application is a divisional of U.S. application Ser. No. 13/230,447, filed Sep. 12, 2011, which claims priority to Korean Patent Application No. 10-2010-0090186, filed Sep. 14, 2010 and Korean Patent Application No. 10-2010-0103017, filed Oct. 21, 2010, the disclosures of which are hereby incorporated herein by reference as if set forth in their entirety.

FIELD

The present inventive concept relates to three-dimensional semiconductor devices and, more particularly, to methods of manufacturing three-dimensional semiconductor memory devices having a plurality of sequentially-stacked thin layers.

BACKGROUND

In order to provide good performance and low prices, integration in three-dimensional semiconductor devices has been increased. In semiconductor memory devices, since its degree of integration is an important factor for determining a product's price, its increased integration is beneficial. In two-dimensional or planar semiconductor memory devices, since its degree of integration is mainly determined by an area that a unit memory cell occupies, it is greatly affected by a level of a fine pattern formation technique. However, since expensive equipment is typically required for forming small patterns, although the degree of integration is a two-dimensional semiconductor memory is increased, it is still limited.

To address these problems, a three-dimensional memory device having a plurality of three-dimensionally arranged memory cells is suggested. However, in order for mass production of a three-dimensional semiconductor memory device, process technologies, which may reduce manufacturing cost per bit to less than that of a two-dimensional semiconductor memory device and realize reliable product characteristics, are required.

SUMMARY

The present disclosure provides methods of manufacturing a three-dimensional semiconductor device with improved reliability and productivity.

Embodiments of the inventive concept provide methods of manufacturing a three-dimensional semiconductor device, the methods including: forming a thin film structure, where first and second material layers of at least 2n (n is an integer more than 2) are alternately and repeatedly stacked, on a substrate; wherein the first material layer applies a stress in a range of about $0.1 \times 10^9$ dyne/cm$^2$ to about $10 \times 10^9$ dyne/cm$^2$ to the substrate and the second material layer applies a stress in a range of about $-0.1 \times 10^9$ dyne/cm$^2$ to about $-10 \times 10^9$ dyne/cm$^2$ to the substrate.

In other embodiments of the inventive concept, methods of manufacturing a three-dimensional device include: loading a substrate into one chamber; alternately and repeatedly stacking oxide layers and sacrificial layers in the chamber; and unloading the substrate from the chamber, wherein an oxygen gas used to deposit the oxide layers includes nitrous oxide.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF EMBODIMENTS

Figure 1:
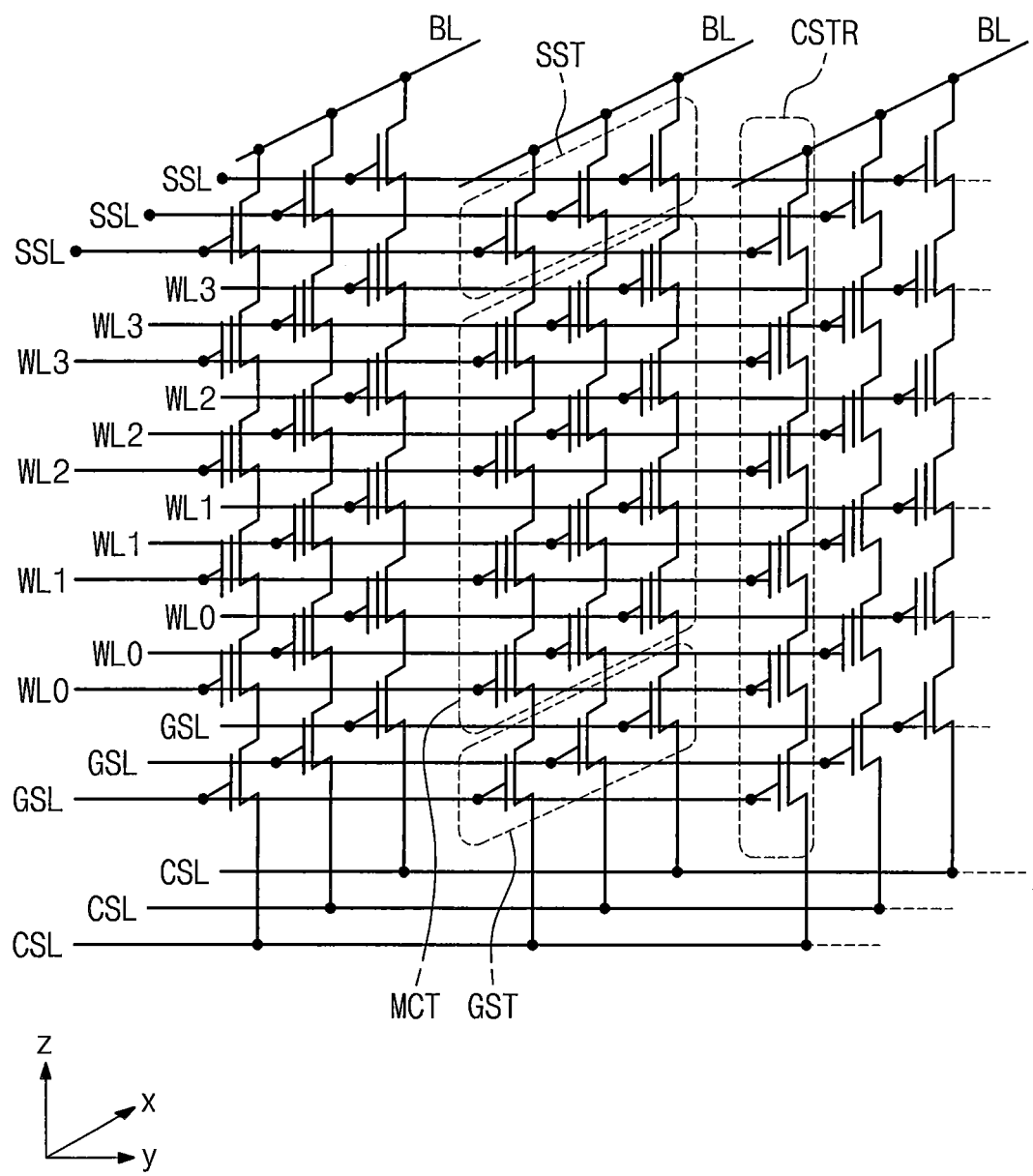
FIG. 1 is a schematic circuit diagram illustrating a cell array of a three-dimensional semiconductor device according to some embodiments of the inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on or "connected to" another element or layer, it can be directly on or connected to the other element or layer or intervening elements or layers may be present. In contrast, when an element is referred to as being "directly on"

or "directly connected to" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the inventive concept. Accordingly, the exemplary views may be modified depending on manufacturing technologies and/or tolerances. Therefore, the embodiments of the inventive concept are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a three-dimensional semiconductor device according to some embodiments of the inventive concept and methods of manufacturing the same will be discussed with respect to FIGS. 1 through 20. As will be discussed, three-dimensional semiconductor devices according to embodiments of the inventive concept may include a cell array region, a peripheral circuit region, and a connection region. In the cell array region, a plurality of memory cells, bit lines and word lines for electrical connections of the memory cells are disposed. In the peripheral circuit region, peripheral circuits for driving the memory cells and reading data stored in the memory cells are formed. More specifically, a word line driver, a sense amplifier, row and column decoders, and control circuit may be disposed in the peripheral circuit region. The connection region may be disposed between the cell array region and the peripheral circuit region and wiring structures connecting the word lines with the peripheral circuit electrically may be disposed in the connection region.

Figure 2:
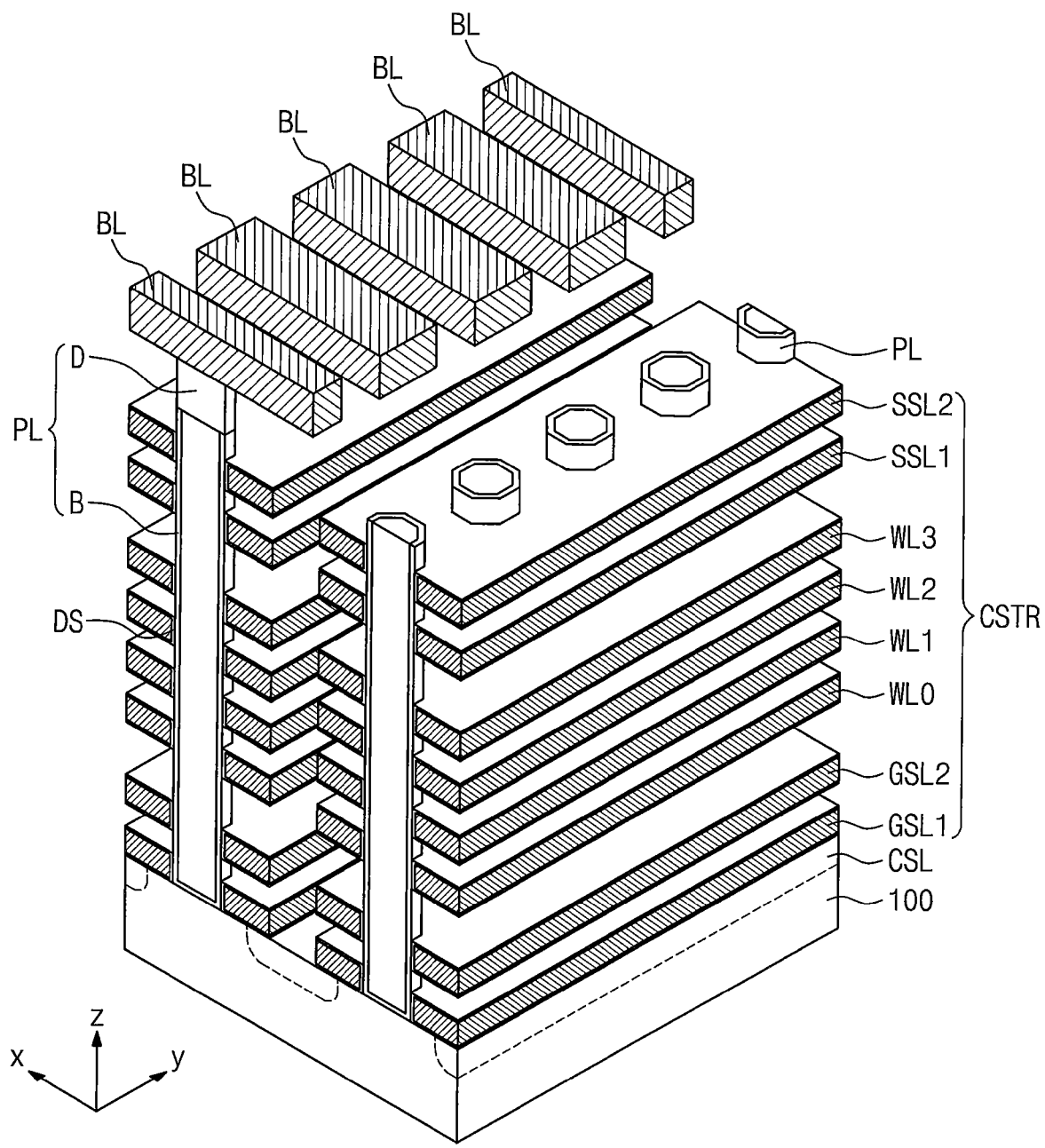
FIG. 2 is a perspective view illustrating a cell array of a three-dimensional semiconductor device according to some embodiment of the inventive concept.

FIG. 1 is a schematic circuit diagram illustrating a cell array of three-dimensional semiconductor devices according to some embodiments of the inventive concept. FIG. 2 is a perspective view illustrating a cell array region of three-dimensional semiconductor devices according to some embodiments of the inventive concept.

Referring first to FIG. 1, a cell array of the three-dimensional semiconductor memory device may include a common source line CSL, a plurality of bit lines BL, and a plurality of cell strings CSTR between the common source line CSL and the bit lines BL.

The bit lines BL are two-dimensionally arranged and a plurality of cell strings CSTR is connected in parallel to the bit lines, respectively. The cell strings CSTR may be commonly connected to the common source line CSL. In other words, a plurality of cell strings CSTR may be disposed between the plurality of bit lines and one common source line CSL. In some embodiments, the common source lines CSL may be two-dimensionally arranged. Here, the same voltage may be applied to the common source lines CSL and each of the common source lines CSL may be electrically controlled.

Each of the cell strings CSTR may include a ground selection transistor GST connected to the common source line CSL, a string selection transistor SST connected to a bit line BL, and a plurality or memory cell transistors MCT between the ground and string selection transistors GST and SST. Moreover, the ground selection transistor GST, the string selection transistor SST, and the memory cell transistors MCT may be connected in series.

The common source line CSL may be commonly connected to sources of the ground selection transistors GST. Furthermore, the ground selection line GSL, the plurality of word lines WL0 to WL3, and the plurality of string selection lines SSL between the common source line CSL and the bit lines BL may serve as gate electrodes of a the ground selection transistor GST, the memory cell transistors MCT, and the string selection transistors SST, respectively. Additionally, each of the memory cell transistors MCT includes a data storage element.

Referring now to FIG. 2, the common source line CSL may be an impurity region formed in a conductive thin layer on the substrate 100 or in the substrate 100. The bit lines BL may be conductive patterns, for example, a metal line, spaced from the substrate 100 and disposed thereon. The bit lines BL are two-dimensionally arranged, and a plurality of cell strings CSTR are connected in parallel to the respective bit lines BL. Accordingly, the cell strings CSTR are two-dimensionally arranged on the common source line CSL or the substrate 100.

Each of the cell strings CSTR includes a plurality of ground selection lines GSL1 and GSL2 between the common source line CSL and the bit lines BL, a plurality of word lines WL0 to WL3, and a plurality of string selection lines SSL1 and SSL2. In some embodiments, the plurality of string selection lines SSL1 and SSL2 may constitute the string selection lines SSL of FIG. 2 and the plurality of ground selection liens GSL1 and GSL2 may constitute the ground selection lines GSL of FIG. 2. Moreover, the ground selection lines GSL1 and GSL2, the word lines WL1 to WL3, and the string selection lines SSL1 and SSL2 may be conductive patterns stacked on the substrate 100.

Additionally, each of the cell strings CSTR may include a semiconductor pillar (or, a vertical semiconductor pattern; PL) that vertically extends from the common source line CSL to connect to the bit line BL. The semiconductor pillars PL may be formed to penetrate the ground selection lines GSL1 and GSL2, the word lines WL0 to WL3, and the string selection lines SSL1 and SSL2. That is, the semiconductor pillars PL may penetrate a plurality of conductive patterns stacked on the substrate 100. Furthermore, the semiconductor pillar PL includes a main body B and impurity regions D at one end or both sides of the main body B. For example, a drain region D may be formed at a top, i.e., between the main body B and the bit line BL, of the semiconductor pillar PL.

A data storage layer DS may be disposed between the word lines WL0 to WL3 and the semiconductor pillars PL. According to some embodiments, the data storage layer DS may be a charge storage layer. For example, the data storage layer DS may be one of a trap insulation layer and an insulation layer including a floating gate electrode or conductive nano dots.

A dielectric layer serving as a gate insulation layer of a transistor may be disposed between the ground selection lines GSL1 and GSL2 and the semiconductor pillars PL or between the string selection lines SSL1 and SSL2 and the semiconductor pillar PL. Here, the dielectric layer may be formed of the same material as the data storage layer DS, and may be a gate insulation layer, for example, a silicon oxide layer, for a typical Metal Oxide Silicon Field Effect Transistor (MOSFET).

In this structure, the semiconductor pillars PL together with the ground selection lines GSL1 and GSL2, the word lines WL0 to WL3, and the string selection lines SSL1 and SSL2 may constitute a MOSFET using the semiconductor pillar as a channel region. Unlike this, the semiconductor pillars PL together with the ground selection lines GSL1 and GSL2, the word lines WL0 to WL3, and the string selection lines SSL1 and SSL2 may constitute a Metal Oxide Silicon (MOS) capacitor.

In these embodiments, the ground selection lines GSL1 and GSL2, the plurality of word lines WL0 to WL3, the plurality of string selection lines SSL1 and SSL2 may serve as gate electrodes of a selection transistor and a cell transistor, respectively. Moreover, due to a fringe field occurring from a voltage applied to the ground selection lines GSL1 and GSL2, the word lines WL0 to WL3, and the string selection lines SSL1 and SSL2, inversion regions may be formed in the semiconductor pillars PL. Here, the maximum distance or width of the inversion region may be greater than a thickness of a word line or a selection line generating the inversion region. Accordingly, the inversion regions in the semiconductor pillar vertically overlap, thereby forming a current path for electrically connecting a bit line selected from the common source line CSL.

That is, the cell string CSTR may have a structure in which ground and string transistors constituted by the lower and upper selection lines GSL1, GSL2, SSL1, and SSL2 are connected in series to the cell transistors MCT of FIG. 2 constituted by the word lines WL0 to WL3.

Operation of the three-dimensional memory device described with reference to FIGS. 1 and 2 will be briefly described as follows. The operation of the three-dimensional memory device is not limited thereto and may be diversely modified. First, a program operation for writing data on memory cells will be described. The same voltage may be applied to the word lines WL0 to WL3 at the same layer and respectively different voltages may be applied to the word lines WL0 to WL3 at respectively different layers. Moreover, a program voltage VPGM is applied to the word lines WL0 to WL3 of a layer including a selected memory cell and a pass voltage VPASS is applied to the word lines WL0 to WL3 of an unselected layer. Here, the program voltage is a high voltage of about 10 V to about 20 V and the pass voltage VPASS is a voltage for turning on memory cell transistors. Additionally, about 0 V is applied to a bit line BL connected to a selected memory cell transistor and a voltage Vcc, i.e., a power supply voltage, is applied to other bit lines BL. Moreover, about 0 V, i.e., a ground voltage, is applied to the ground selection lines GSL so that all the ground selection transistors are turned off. Furthermore, a voltage Vcc is applied to the selected string selection line SSL and about 0 V is applied to the unselected string selection line SSL. Under this voltage condition, a selected string selection transistor SST and memory cell transistors MCT in the selected cell string CSTR may be turned on. Therefore, a channel of the memory cell transistors MCT in the selected cell string CSTR is equipotential with the selected bit line BL, i.e., about 0 V. At this point, since a program voltage VPGM of a high voltage is applied to the word lines WL0 to WL3 of the selected memory cell transistor MCT, an F-N tunneling phenomenon occurs so that data may be written on the selected memory cell transistor.

Then, a read operation for reading data written on memory cells will be described. The same voltage may be applied to the word lines WL0 to WL3 at the same layer and respectively different voltages may be applied to the word lines WL0 to WL3 at respectively different layers. In particular, for a read operation, about 0 V is applied to the word lines WL0 to WL3 connected to a selected memory cell transistor MCT and a read voltage Vread is applied to the word lines WL0 to WL3 of unselected memory cell transistors at a different layer. Here, the read voltage Vread is a voltage for turning on the unselected memory cell transistors. Moreover, a bit line voltage of about 0.4 V to about 0.9 V may be applied to a selected bit line BL and about 0 V is applied to other bit lines BL. Moreover, about 0 V is applied to the common source line CSL and a read voltage Vread is applied to the ground selection lines GSL, so that a channel of the selected memory cell transistor MCT may be connected to the common source line CSL. Additionally, a read voltage Vread is applied to the selected string selection line SSL and about 0 V is applied to the unselected string selection line SSL. Under this voltage condition, according to data (0 or 1) of the selected memory cell, the memory cell transistor MCT may be turned on or off. When the selected memory cell transistor MCT is turned on, current flow may occur in the cell string CSTR and a change of current flowing in the cell string CSTR may be sensed through the selected bit line BL.

For example, after electrons are stored in the selected memory cell transistor MCT, the selected memory cell transistor MCT is turned off and a voltage of the selected bit line BL is not delivered to the common source region CSL. Unlike this, when electrons are not stored in the selected memory cell transistor MCT, the selected memory cell is turned on by a read voltage and a voltage of the bit line BL is delivered to the common source line CSL.

Then, an erase operation of a three-dimensional semiconductor device will be described. According to some embodiments, the erase operation may be performed by emitting charges stored in the memory cell transistor MCT to the semiconductor pillar PL. According to further embodiments, the erase operation may be performed by injecting charges having an opposite type to charges stored in the data storage layer into the data storage layer. According to still further embodiments, one of memory cell transistors may be selected and erased or memory cell transistors MCT of a block unit may be simultaneously erased.

Figure 3:
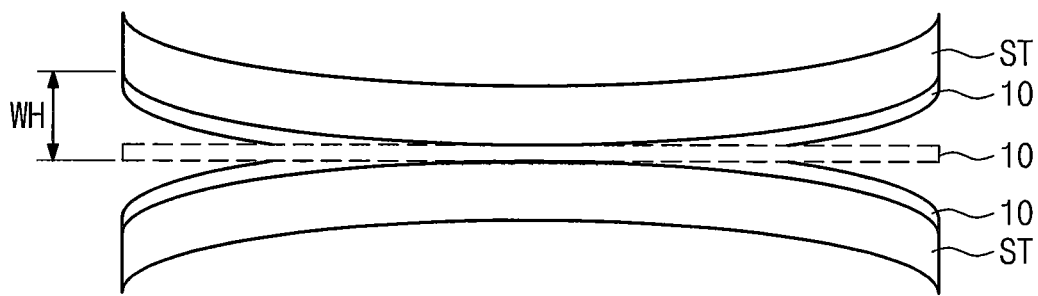
FIG. 3 is a diagram illustrating a three-dimensional semiconductor device according to some embodiments of the inventive concept.

Referring now to FIG. 3, a view illustrating methods of manufacturing a three-dimensional semiconductor device according to some embodiments of the inventive concept will be discussed. As illustrated in FIG. 3, in the three-dimensional semiconductor device, in order to form three-dimensionally arranged word lines, a thin film structure ST, where a plurality of first and second material layers 10 and 20 are alternately and repeatedly stacked, may be formed on a substrate 100. Here, the first and second material layers may be continuously stacked with at least more than 2n, n being an integer greater than 2, layers.

This thin film structure ST may provide stress to the substrate 100, i.e., a wafer, and due to this, as shown in FIG. 3, a warpage phenomenon may occur. Moreover, as stress applied on the substrate 100 is increased, a warpage phenomenon of the substrate 100 becomes worse and cracks between the first and second material layers 10 and 20 may occur. Additionally, as the substrate 100 becomes bent, a process margin becomes changed during a following process or a process error may occur in semiconductor equipment.

Meanwhile, according to embodiments of the inventive concept, stress applied to the substrate 100 by the thin film structure ST may be alleviated by adjusting the first and second material layers 10 and 20 constituting the thin film structure ST. Accordingly, cracks of the first and second material layer 10 and 20 may be prevented and a warpage phenomenon of the substrate 100 may be suppressed. Accordingly, process errors in manufacturing processes of the three-dimensional semiconductor device may be reduced and furthermore, productivity of manufacturing processes for a semiconductor device may be improved.

Figure 4A:
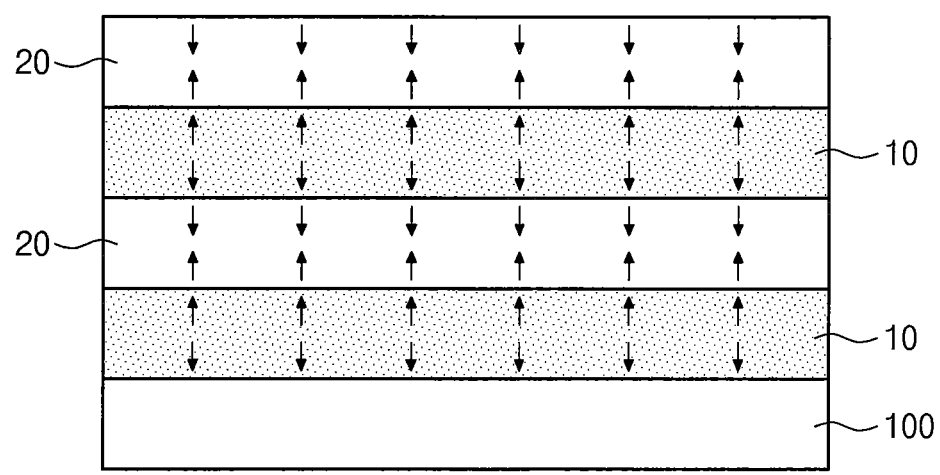
FIGS. 4A through 4C are diagrams illustrating methods of forming a thin film structure for a three-dimensional semiconductor device according to some embodiments of the inventive concept.
Figure 4B:
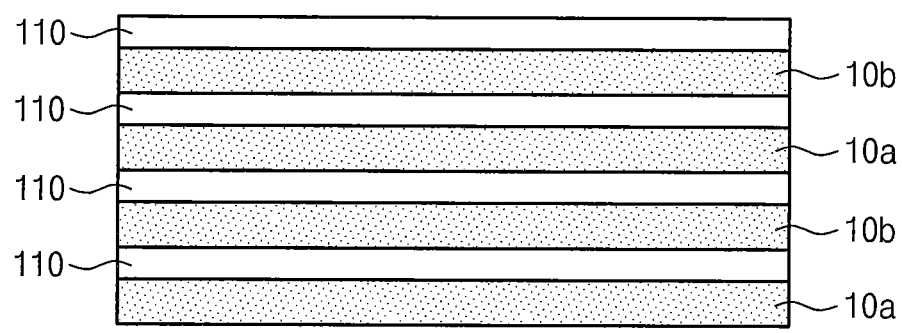
Figure 4C:
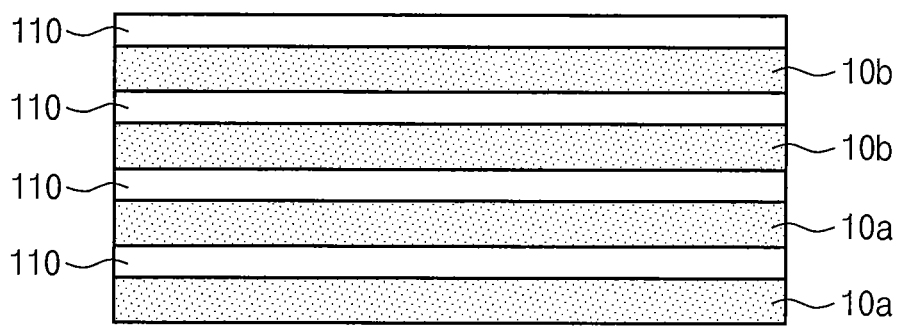

Referring now to FIGS. 4A through 4C, methods of forming a thin film structure in a three-dimensional semiconductor device according to some embodiments of the inventive concept will be discussed. FIG. 4A through 4C are views illustrating methods of forming a thin film structure in a three-dimensional semiconductor device according to some embodiments of the inventive concept. Referring first to FIG. 4A, the thin film structure ST of FIG. 3 may be formed on a substrate 100 by alternately and repeatedly stacking first material layers 10 and second material layers 20.

The first material layers 10 and the second material layers 20 may be layers having tensile stress and/or compressive stress. According to some embodiments, the first material layers 10 and the second material layers 20 may have stresses of respectively opposite types. For example, the first material layers 10 may be layers having tensile stress and the second material layers 20 may be layers having compressive stress. That is, according to some embodiments, the thin film structure may have tensile stress layers and compressive stress layers, which are alternately and repeatedly stacked. According to some embodiments, the first material layers 10 and the second material layers 20 may have a high etch selectivity during a wet etching process and may have a low etch selectivity during a dry etching process. Additionally, the first material layers 10 and the second material layers 20 may have the same thickness or respectively different thicknesses.

The first material layers 10 and the second material layers 20 may be deposited through thermal chemical vapor deposition (CVD), plasma enhanced (PE) CVD, physical CVD, or atomic layer deposition (ALD).

According to some embodiments, the first material layers 10 and the second material layers 20 may be deposited under a plasma atmosphere after plasma is generated from a reaction gas. For example, the first material layers 10 and the second material layers 20 may be deposited through plasma deposition equipment of a remote plasma CVD method, a microwave plasma CVD method, an inductively coupled plasma (ICP) method, a dual frequency capacitively coupled plasma (CCP) method, a helicon plasma CVD method, or a high density plasma method.

The first material layers 10 may be at least one of a silicon layer, a silicon oxide layer, a silicon carbide layer, a silicon oxynitride layer, and a silicon nitride layer. The second material layers 20 may be at least one of a silicon layer, a silicon oxide layer, a silicon carbide layer, a silicon oxynitride layer, and a silicon nitride layer and may be formed of a different material than the first material layer 10.

The first material layers 10 may be formed of a silicon nitride layer and the second material layers 20 may be formed of a silicon oxide layer. Moreover, a silicon oxide layer constituting the second material layer 20 may be a high density plasma (HDP) oxide layer, or may be formed of TetraEthylorthoSilicate (TEOS), Plasma Enhanced TetraEthylOrthoSilicate (PE-TEOS), O3-Tetra Ethyl Ortho Silicate (O3-TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) or combinations thereof.

In the thin film structure, when the first material layers 10 are formed through LP-CVD or thermal-CVD, tensile stress applied to the substrate 100 may be increased. Accordingly, a warpage phenomenon of the substrate 100 becomes worse and cracks between the first and second material layers 10 and 20 may occur.

Additionally, when a silicon nitride layer is formed through an LP-CVD method, since it is formed in a chamber of a batch type, the silicon nitride layer may be deposited on the front and rear of the substrate 100. Accordingly, a process for removing the silicon nitride layer deposited on the rear of the substrate 100 is required to perform the next process.

Meanwhile, according to some embodiments, the first and second material layers 10 and 20 may be formed through a PE-CVD method. When the PE-CVD method is used to form the first and second material layers 10 and 20, stresses of the first and second material layers 10 and 20 may vary according to a composition and/or thickness of a reaction substance. Additionally, stresses of the first and second material layers 10 and 20 may vary according to changes of deposition parameters such as a deposition temperature, an RF power, a pressure, a reaction gas mixing rate during a PE-CVD process and a concentration and a reaction type of a carrier gas.

Additionally, when a PE-CVD process is performed in a chamber of a single type, a process for removing a thin film structure on the rear of the substrate 100 (which is formed when the thin film structure is formed in a chamber of a batch type) may be omitted.

According to some embodiments, a silicon nitride layer (i.e., the first material layer 10) may have tensile stress and a silicon oxide layer (i.e., the second material layer 20) may have compressive stress. That is, the thin film structure may be formed by alternately and repeatedly stacking a tensile stress layer and a compressive stress layer.

According to some embodiments, the stacking of the silicon nitride layer and the silicon oxide layer alternately and repeatedly may be performed in-situ in a sealed chamber where a PE-CVD process is performed. In particular, the forming of the thin film structure includes forming a silicon nitride layer using silicon source gas and nitrogen source gas, performing a first purge process, forming a silicon oxide layer using silicon source gas and oxygen source gas, and performing a second purge process.

In particular, when the silicon nitride layer is formed using a PE-CVD method, it may be deposited using silicon source gas and nitrogen source gas. Here, the silicon source gas may be at least one of $SiH_4$, $Si_2H_6$, $SiH_3Cl$, and $SiH_2Cl_2$ and the nitrogen source gas may be $NH_3$ and/or $N_2$. Additionally, the carrier gas may be $N_2$ and/or He gas.

The silicon nitride layer formed through the above deposition process may contain hydrogen and also include Si—N bonding, N—H bonding, Si—H bonding, and Si—O bonding. Moreover, stress of a silicon nitride layer may vary according to a hydrogen content and a ratio of N—H bonding/Si—H bonding. In particular, as a ratio of N—H bonding/Si—H bonding is decreased, tensile stress is increased and as a ratio of N—H bonding/Si—H bonding is increased, compressive stress is increased. Furthermore, in relation to the silicon nitride layer, a hydrogen content and a ratio of N—H bonding/Si—H bonding may vary according to a deposition temperature of the silicon nitride layer. In particular, as a deposition temperature is increased during the forming of the silicon nitride layer, a hydrogen content and a ratio of N—H bonding/Si—H bonding in the silicon nitride layer may be reduced.

When a silicon oxide layer is formed using a PE-CVD method, it may be deposited using silicon source gas or oxygen source gas. Here, silicon source gas may be at least one of $SiH_4$, $Si_2H_6$, $SiH_3Cl$, $SiH_2Cl_2$, and TEOS and the oxygen source gas may be $N_2O$, $O_2$ and/or $O_3$ (ozone). The silicon oxide layer formed through the deposition process may include Si—O and Si—OH bonding and as Si—OH bonding is decreased compressive stress may be increased.

According to some embodiments, a silicon nitride layer may be formed at a deposition temperature of about 250° C. to about 650° C. Additionally, the silicon nitride layer may be formed in a sealed chamber with $SiH_4$ gas of about 10 sccm to about 100 sccm, $NH_3$ gas of about 10 sccm to 100 sccm, $N_2$ gas of about 1.0 slm to about 5.0 slm, and RF power of about 50 W to about 10000 W. The silicon nitride layer may have an N—H bonding/Si—H bonding ratio of about 1.0 to about 5.0 and may have a stress of about $0.1 \times 10^9$ dyne/cm$^2$ to about $10 \times 10^9$ dyne/cm$^2$.

According to some embodiments, a silicon nitride layer may be formed at a deposition temperature of about 250° C. to about 650° C. Additionally, the silicon nitride layer may be formed in a sealed chamber with $SiH_4$ gas of about 10 sccm to about 100 sccm, $N_2O$ gas or $O_2$ of about 10 sccm to 100 sccm, and RF power of about 50 W to about 10000 W. The silicon nitride layer may have a stress of about $-0.1 \times 10^9$ dyne/cm$^2$ to about $-10 \times 10^9$ dyne/cm$^2$.

Thus, since a thin film structure is formed by alternately and repeatedly stacking tensile stress layers and compressive stress layers, stress applied to the substrate 100 by the thin film structure may be adjusted. That is, as shown in FIG. 4A, stress applied to the substrate 100 may be cancelled out by the tensile stress of the first material layers and the compressive stress of the second material layers 20. Accordingly, the stress applied to the substrate 100 by the thin film structure is reduced so that the warpage of the substrate 100 may be suppressed as shown in FIG. 3. Moreover, according to some embodiments, after forming a thin film structure on the substrate 100, the degree of warpage in the substrate 100, i.e., a warpage height WH of FIG. 3 between the center and edge of the substrate 100, may be reduced to less than about ±200 µm.

Moreover, according to further embodiments, the first material layer 10 formed of a silicon nitride layer may have compressive stress and the second material formed of a silicon oxide layer may have tensile stress. For example, through a PE-CVD method, the silicon nitride layer having a ratio of N—H bonding/Si—H bonding ratio of about 5 to about 20 may be formed by changing deposition parameters in a PE-CVD process such as temperature, RF power, pressure, a reaction gas mixing rate, and a reaction type.

Furthermore, according to still further embodiments, in order to reduce tensile stress of the silicon nitride layer, a hydrogen processing process is performed to increase a hydrogen content in the silicon nitride layer. On the contrary, in order to increase tensile stress applied to the substrate 100 by the silicon nitride layer, a plasma processing process using nitrogen radicals may be performed. Accordingly, Si—N bonding may become denser in the silicon nitride layer.

Additionally, according to some embodiments, after a silicon oxide layer having compressive stress is formed of the second material layer 20, a dehydrogenation process is performed to reduce the compressive stress of the silicon oxide layer. For example, the dehydrogenation includes performing a plasma process, UV process, or a thermal process at a dehydrogenation gas atmosphere and the dehydrogenation gas may be $N_2$, $O_2$, $O_3$, $N_2O$, and combinations thereof. Thus, once a dehydrogenation process is performed on the silicon oxide layer, Si—OH bonding is reduced in the silicon oxide layer so that hydrogen ions may be reduced and tensile stress may be increased by a void formed in the dehydrogenated silicon oxide layer.

According to still further embodiments, first and second material layers 10 and 20 are alternately and repeatedly stacked to form a thin film structure. The first material layers 10 may be formed of a silicon nitride layer having compressive stress and the second material layers 20 may be formed of a silicon oxide layer such as PhosphoSilicate Glass (PSG), Borosilicate Glass (BSG), and BoroPhosphoSilicate Glass (BPSG). Here, an impurity such as Ge ion may be implanted into or a UV processing process may be formed on the silicon nitride layer having compressive stress. Accordingly, after the forming of the silicon nitride layer having compressive stress, processes for alleviating the compressive stress are performed so that the stress of the thin film structure having alternately and repeatedly stacked first and second material layers may be alleviated.

As illustrated in embodiments of FIG. 4B, first material layers 10a and 10b and second material layers 110 are alternately and repeatedly stacked to form a thin film structure and the first material layers 10a and 10b may have tensile or compressive stress. For example, the first material layers 10a and 10b are stacked with the second material layer 110 interposed and at this point, in relation to the first and second material layers 10a and 10b, a silicon nitride layer having tensile stress and a silicon nitride layer having compressive stress may be alternately stacked. Also, the second material layers 110 may be formed of a silicon oxide layer such as PhosphoSilicate Glass (PSG), Borosilicate Glass (BSG), and BoroPhosphoSilicate Glass (BPSG). That is, a silicon nitride layer having tensile stress, a silicon oxide layer, a silicon nitride layer having compressive stress, and a silicon oxide layer may be sequentially and repeatedly formed on the substrate 100. Accordingly, stress applied to the substrate may be alleviated by a thin film structure formed of the plurality of first and second material layers 10a, 10b, and 110.

According to embodiments illustrated in FIG. 4C, first and second material layers 10a, 10b, and 110 are alternately and repeatedly stacked to form a thin film structure and the first material layers 10a and 10b may have tensile or compressive stress. Here, the first material layers 10a and 10b constituting a bottom of the thin film structure may apply tensile stress on the substrate 100 and the first material layers 10a and 10b constituting a top of the thin film structure may apply compressive stress on the substrate 100. For this, the first material layers 10a and 10b may be formed of a silicon nitride layer formed using a PE-CVD method and the first material layers 10a and 10b constituting a bottom of the thin film structure may have a N—H bonding/Si—H bonding ratio of about 1 to about 5. The first material layers 10a and 10b constituting a top of the thin film structure may have an N—H bonding/Si—H bonding ratio of about 5 to about 110. Furthermore, the first material layers 10a and 10b constituting a bottom of the thin film structure may be formed at a first deposition temperature and the first material layers 10a and 10b constituting a top of the thin film structure may be formed at a second deposition temperature lower than the first deposition temperature.

According to embodiments of the inventive concept, while the first and second material layers 10 and 20 may be repeatedly stacked, a deposition condition may be changed according to the degree of warpage in the substrate 100. For example, when the first and second material layers 10 and 20 are deposited using a PE-CVD method, deposition parameters such as temperature, RF power, pressure, a reaction gas mixing rate, and a reaction type.

Figure 5:
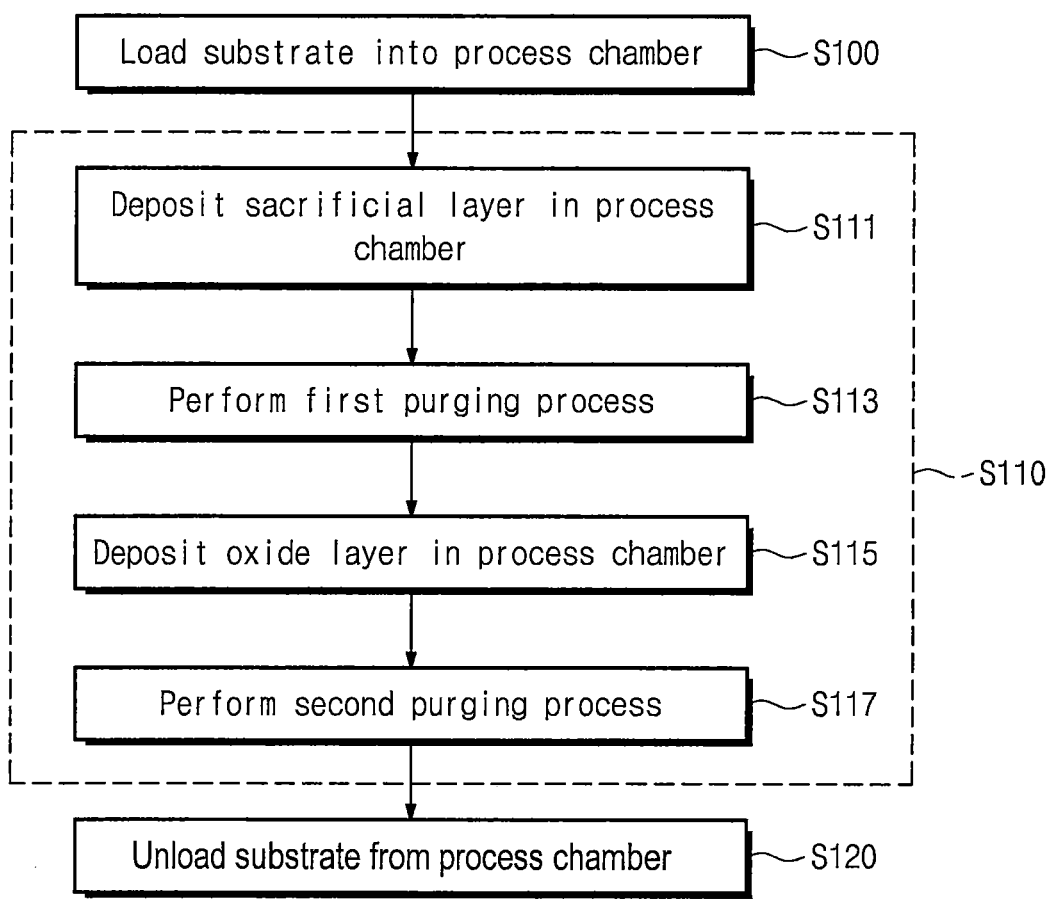
FIG. 5 is a flowchart illustrating processing steps in the fabrication of a thin film structure of a three-dimensional semiconductor device according to some embodiments of the inventive concept.

Hereinafter, methods of manufacturing a three-dimensional semiconductor device including forming a layer stacked structure with a plurality of stacked sacrificial layers and oxide layers will be described with reference to FIGS. 4A and 5. FIG. 5 is a flowchart illustrating methods of alternately and repeatedly stacking oxide layers and sacrificial layers in relation to methods of manufacturing a three-dimensional semiconductor device according to some embodiments of the inventive concept.

Referring to FIG. 5, a substrate 100 may be loaded into a process chamber in operation S100. Deposition equipment including the process chamber may further include a load lock chamber, a transfer chamber, and a transfer robot. The substrate 100 may transfer into the transfer chamber through the load lock chamber. The substrate 100 may be loaded into the process chamber using the transfer robot disposed in the transfer chamber.

Referring to FIGS. 4A and 5, a sacrificial layer 10 and an oxide layer 20 may be formed in the process chamber in operation S110. The sacrificial layer 10 and the oxide layer 20 may be formed through a CVD method. According to some embodiments, the CVD method may include a PE-CVD method. The PE-CVD method generates plasma using microwave or RF power to deposit a thin layer at a plasma atmosphere. Additionally, the process chamber may be a chamber of a single type.

The sacrificial layer 10 and the oxide layer 20 may be formed of material having respectively different etch selectivities. The sacrificial layer 10 may be a silicon nitride layer and the oxide layer 20 may be a silicon oxide layer. For example, the silicon oxide layer constituting the oxide layer 20 may include Plasma Enhanced TetraEthylOrthoSilicate (PE-TEOS), Undoped Silicate Glass (USG), PhosphoSilicate Glass (PSG), Borosilicate Glass (BSG), BoroPhosphoSilicate Glass (BPSG), and combinations thereof.

Operation S110 includes depositing the sacrificial layer 10 in operation S111, performing a purging process in operation S113, depositing the oxide layer in operation S115, and performing a second purging process in operation S117.

The depositing of the sacrificial layer 10 in operation S111 may be performed using a first gas mixture. The first gas mixture may include silicon source gas and nitrogen source gas. For example, the silicon source gas may include at least one of silane or TEOS gas. The nitrogen source gas may include at least one of ammonia gas or nitrogen gas. The sacrificial layer 10 may be formed on the substrate 100 by a chemical reaction of the silicon source gas and the nitrogen source gas.

The first gas mixture may further include carrier gas. The carrier gas may include at least one of nitrogen, argon, or helium. According to some embodiments, the first gas mixture may include silicon gas of about 10 sccm to about 100 sccm, nitrogen source gas of about 10 sccm to about 100 sccm, and carrier gas of about 1.0 sccm to about 5.0 sccm.

The performing of the first purging process in operation S113 may discharge a first gas mixture used for depositing the sacrificial layer 10 and a by-product occurring during the depositing of the sacrificial layer 10 to the outside of the process chamber.

The depositing of the oxide layer 20 in operation S115 may be performed using a second gas mixture on the sacrificial layer 10 and the second gas mixture may include silicon source gas and oxygen source gas. For example, the silicon source gas may include at least one of silane gas or TEOS gas.

According to embodiments of the inventive concept, the oxygen source gas may include $N_2O$. The oxide layer 20 may be formed on the sacrificial layer 10 by a chemical reaction of the silicon source gas and the $N_2O$ gas.

The second gas mixture may further include a carrier gas. The carrier gas may include at least one of nitrogen, argon, or helium. According to some embodiments, the second gas mixture may include a silicon source gas of about 10 sccm to about 100 sccm, a nitrous oxide of about 10 sccm to about 100 sccm, and a carrier gas of about 1.0 sccm to about 5.0 sccm.

The second purging process in operation S117 may discharge a second gas mixture used for depositing the oxide layer 20 and a by-product occurring during the depositing of the oxide layer 20 to the outside of the process chamber.

The depositing of the sacrificial layer 10 in operation S111 and the depositing of the oxide layer 20 in operation S115 may be performed at a process temperature of about 250° C. to about 650° C. and may form plasma using an RF power of about 50 W to about 1000 W.

A plurality of operations S110 may be repeatedly performed in the one process chamber. Accordingly, a layer stacked structure where the sacrificial layer 10 and the oxide layers 20 are alternately and repeatedly stacked on the substrate 100 may be formed.

In the above method, according to operation S110, the sacrificial layer 10 may be formed first and then, the oxide layer 20 may be formed. However, the inventive concept is not limited thereto. For example, the oxide layer 20 may be formed first and then, the sacrificial layer 10 may be formed. In these embodiments, the first purging process in operation S113 may discharge a second gas mixture used for depositing the oxide layer 20 and a by-product occurring during the depositing of the oxide layer 20 to the outside of the process chamber. Additionally, the second purging process in operation S117 may discharge a first gas mixture used for depositing the sacrificial layer 10 and a by-product occurring during the depositing of the sacrificial layer 10 to the outside of the process chamber.

Referring again to FIG. 5, the substrate where the sacrificial layer 10 and the oxide layers 20 are alternately and repeatedly deposited may be unloaded from a process chamber in operation S120. The substrate 100 having the layer stacked structure may be unloaded into the load lock chamber through the transfer chamber. The substrate 100 having the layer stacked structure may be unloaded from the process chamber using a transfer robot in a transfer chamber.

According to some embodiments of the inventive concept, since the layer stacked structure is formed in one process chamber, a time for transferring each of the sacrificial layer 10 and the oxide layer 20 to a plurality of chambers to form them 10 and 20 may be reduced, so that productivity of the layer stacked structure may be improved.

Figure 6A:
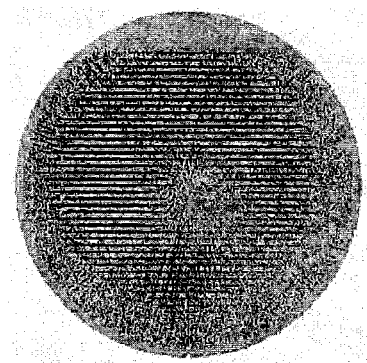
FIGS. 6A through 6D are wafer particle maps illustrating occurrences of particles in gas reaction tests in accordance with some embodiments of the present inventive concept.

Gases used for forming the sacrificial layers 10 and the oxide layers 20 in one process chamber are combined and tested for gas reactions. FIGS. 6A through 6D are wafer particle maps illustrating occurrences of particles in gas reaction tests. FIG. 6A illustrates occurrences of particles on a bulk wafer after the reactions of silane gas, TEOS gas, and oxygen gas ($O_2$). As shown in FIG. 6A, particles occurs greatly on the entire surface of the bulk wafer by the reactions of at least two kinds of gases selected from silane gas, TEOS gas, and oxygen gas ($O_2$).

Figure 6B:
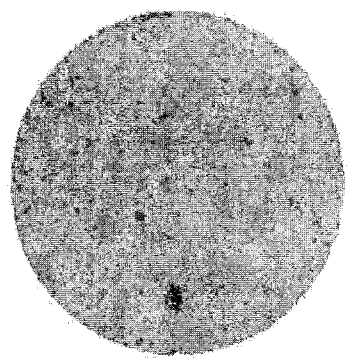

FIG. 6B illustrates occurrences of particles on a bulk wafer after the reactions of TEOS gas, ammonia gas, and oxygen gas ($O_2$). In these embodiments, the generated amount of particles on the bulk wafer is reduced more compared to the case of FIG. 5A. Compared to gases used in FIG. 5A, silane gas is not used in FIG. 5B.

Figure 6C:
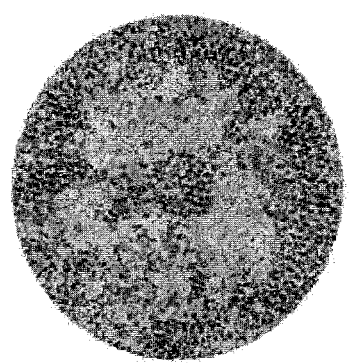

FIG. 6C illustrates occurrences of particles on a bulk wafer after the reactions of silane gas, TEOS gas, and oxygen gas ($O_2$). In these embodiments, similar to the case of FIG. 6A, a large amount of particles occurs on the bulk wafer. Compared to gases used in FIG. 6B, silane gas is used in FIG. 6C.

Figure 6D:
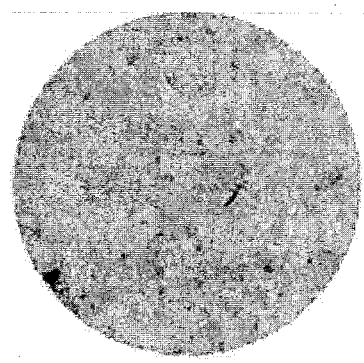

FIG. 6D illustrates occurrences of particles on a bulk wafer after the reactions of silane gas, TEOS gas, and oxygen gas ($O_2$). In these embodiments, similar to the case of FIG. 6B, the generated amount of particles on the bulk wafer is less than the case of FIG. 6A. Compared to gases used in FIG. 6C, oxygen gas ($O_2$) is not used in FIG. 6D.

According to results of the gas reaction tests of FIGS. 6A through 6D, when the sacrificial layers 10 and the oxide layers 20 are deposited in one process chamber, particles occurs on the substrate 100 by the reaction of silane gas used for depositing the sacrificial layers 10 with oxygen gas ($O_2$) used for depositing the oxide layer 20. After the depositing of the sacrificial layer 10, the reaction of silane gas un-discharged during the first purging process in operation S113 with oxygen gas ($O_2$) used for depositing the oxide layer 20 may increase occurrences of particles on the substrate 100. However, according to embodiments of the inventive concept, since nitrogen dioxide ($N_2O$) instead of oxygen ($O_2$) is used as an oxygen source gas, particles occurring on the substrate 100 may be minimized. Accordingly, reliability and electrical characteristics of a three-dimensional semiconductor device may be improved.

Methods of manufacturing three-dimensional semiconductor memory devices using a thin film structure according to embodiments of the inventive concept will be discussed with reference to FIGS. 7 through 14. FIGS. 7 through 14 are perspective views illustrating methods of manufacturing three-dimensional semiconductor memory devices according to some embodiments of the inventive concept.

Figure 7:
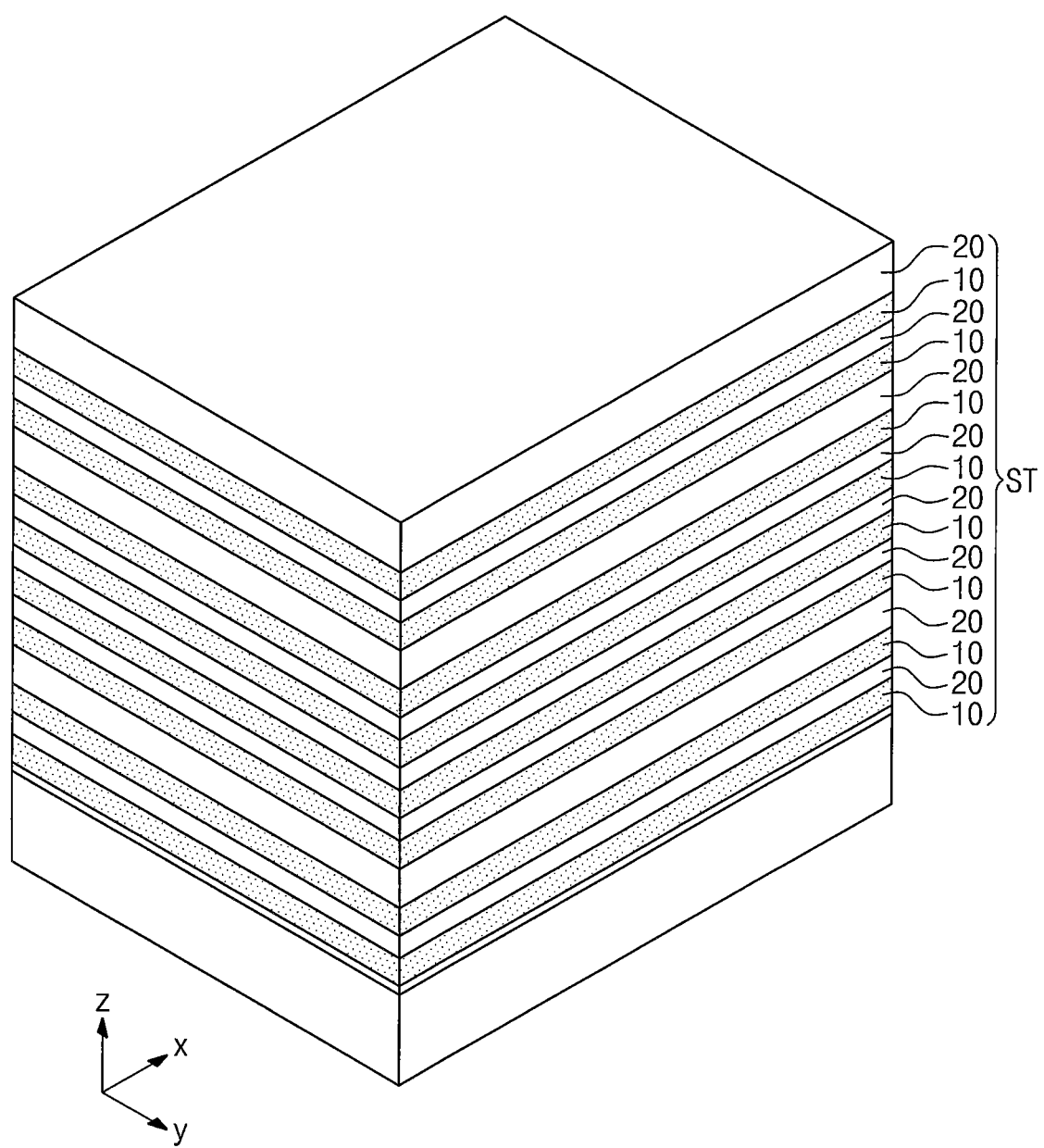
FIGS. 7 through 14 are perspective views illustrating processing steps in the fabrication of three-dimensional semiconductor memory devices according to some embodiments of the inventive concept.

Referring first to FIG. 7, a thin film structure ST where sacrificial layers SC1 to SC8 and insulation layers 111 to 118 are alternately stacked is formed on a substrate 100. The substrate 100 may be one of a material with semiconductor characteristics, for example, a silicon wafer, a silicon layer, a germanium layer, and a silicon germanium layer, an insulation material, for example, an insulation layer (an oxide and a nitride) and glass, and a semiconductor covered with an insulation material.

The sacrificial layers SC1 to SC8 and the insulation layers 111 to 118 may be alternately and repeatedly stacked as shown in the drawings. The sacrificial layers SC1 to SC8 and the insulation layers 111 to 118 may be formed of materials selected to have an etch selectivity. For example, the insulation layers 111 to 118 may be at least one of a silicon layer, a silicon oxide layer, a silicon carbide layer, and a silicon nitride layer and the sacrificial layers SC1 to SC8 may be formed of a different material than an insulation layer selected from a silicon layer, a silicon oxide layer, a silicon carbide layer, and a silicon nitride layer. According to some embodiments, the sacrificial layers SC1 to SC8 may be formed of the first material described with reference to FIGS. 3 through 6 and the insulation layers 111 to 118 may be formed of the second material. Additionally, according to this embodiment, the sacrificial layers SC1 to SC8 and the insulation layers 111 to 118 may be stacked more than at least 2n layers, n being an integer greater than 2.

According to some embodiments, the sacrificial layers SC1 to SC8 may be formed with the same thickness. Unlike this, the lowermost upper sacrificial layer SC1 and the uppermost upper layer SC8 among the sacrificial layers SC1 to SC8 may be formed thicker than those SC2 to SC7 therebetween. In some embodiments, the sacrificial layers SC2 to SC7 between the lowermost upper sacrificial layer SC1 and the uppermost upper layer SC8 may be formed with the same thickness.

According to some embodiments, the uppermost insulation layer 118 among the insulation layers 111 to 118 may be formed thicker than those 111 to 117 therebelow. Moreover, the insulation layers 111 to 117 below the uppermost insulation layer 118 may be formed with the same thickness. Additionally, the insulation layers 112 and 116 formed on a predetermined layer among the insulation layers 111 to 118 may be formed thicker than the other insulation layers 111, 113, 114, 115, and 117, as shown in the drawings.

Moreover, a buffer insulation layer 101 may be formed between the lowermost sacrificial layers SC1 and the substrate 100. The buffer insulation layer 101 may be formed thinner than other insulation layers 111 to 118 and may be a silicon oxide layer formed through a thermal oxidation process.

Figure 8:
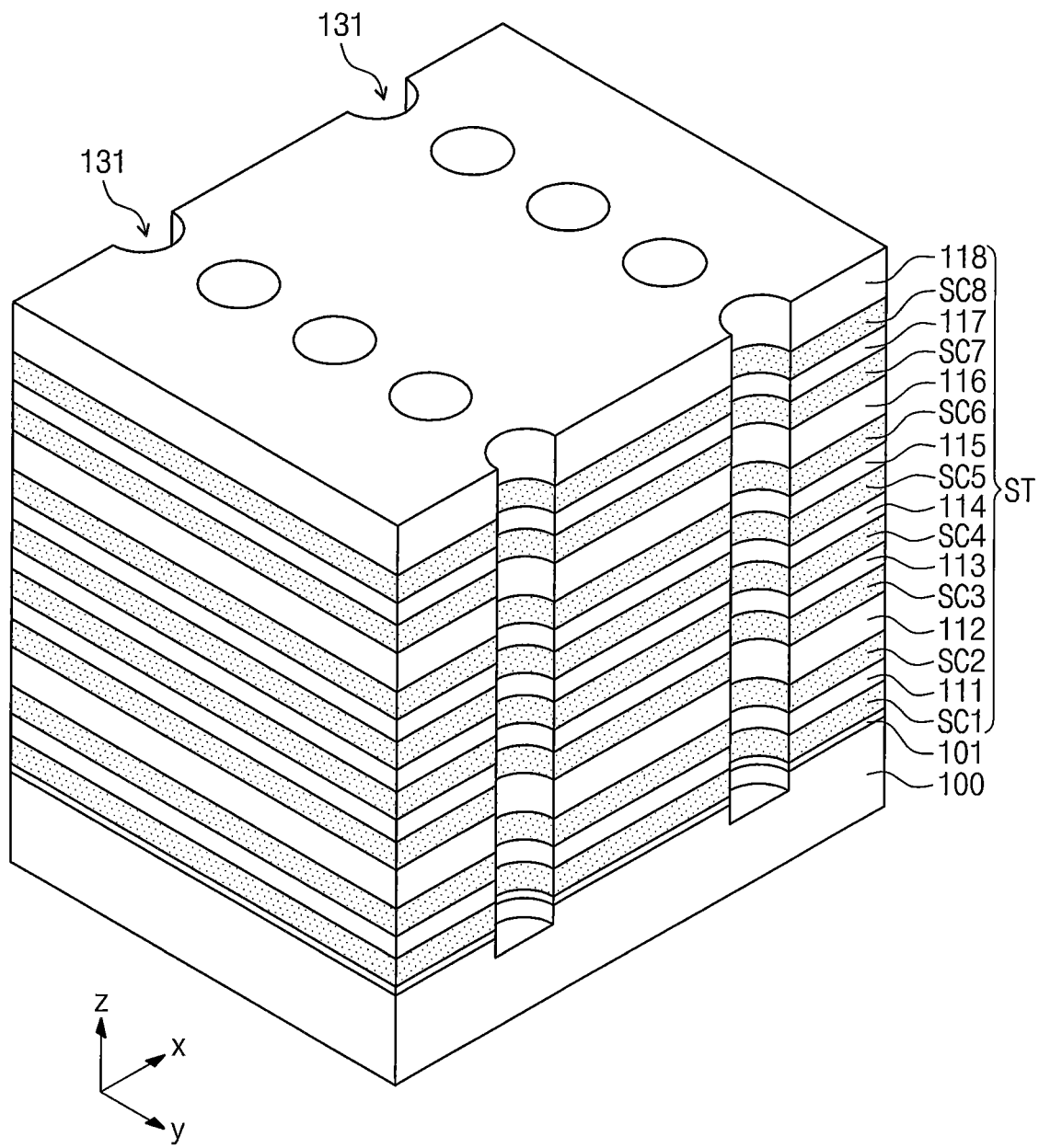

Referring now to FIG. 8, openings 131 that expose the substrate 100 are formed by patterning a thin film structure ST. In particular, the forming of the openings 131 includes forming a mask pattern (not shown) defining planar positions of the openings 131 on a thin film structure ST and unisotropically etching the thin film structure ST using a mask pattern as an etching mask.

The openings 131 may be formed to expose sidewalls of the sacrificial layers SC1 to SC8 and the insulation layers 111 to 118. Additionally, according to some embodiments, the openings 131 may be formed to penetrate the buffer insulation layer 101 and expose a top surface of the substrate. Additionally, during the forming of the openings 131, a top surface of the substrate exposed to the opening 131 through over etch may be recessed with a predetermined depth. Moreover, the openings 131 may have different widths according to a distance from the substrate 100 through an anisotropic etching process.

Figure 16:
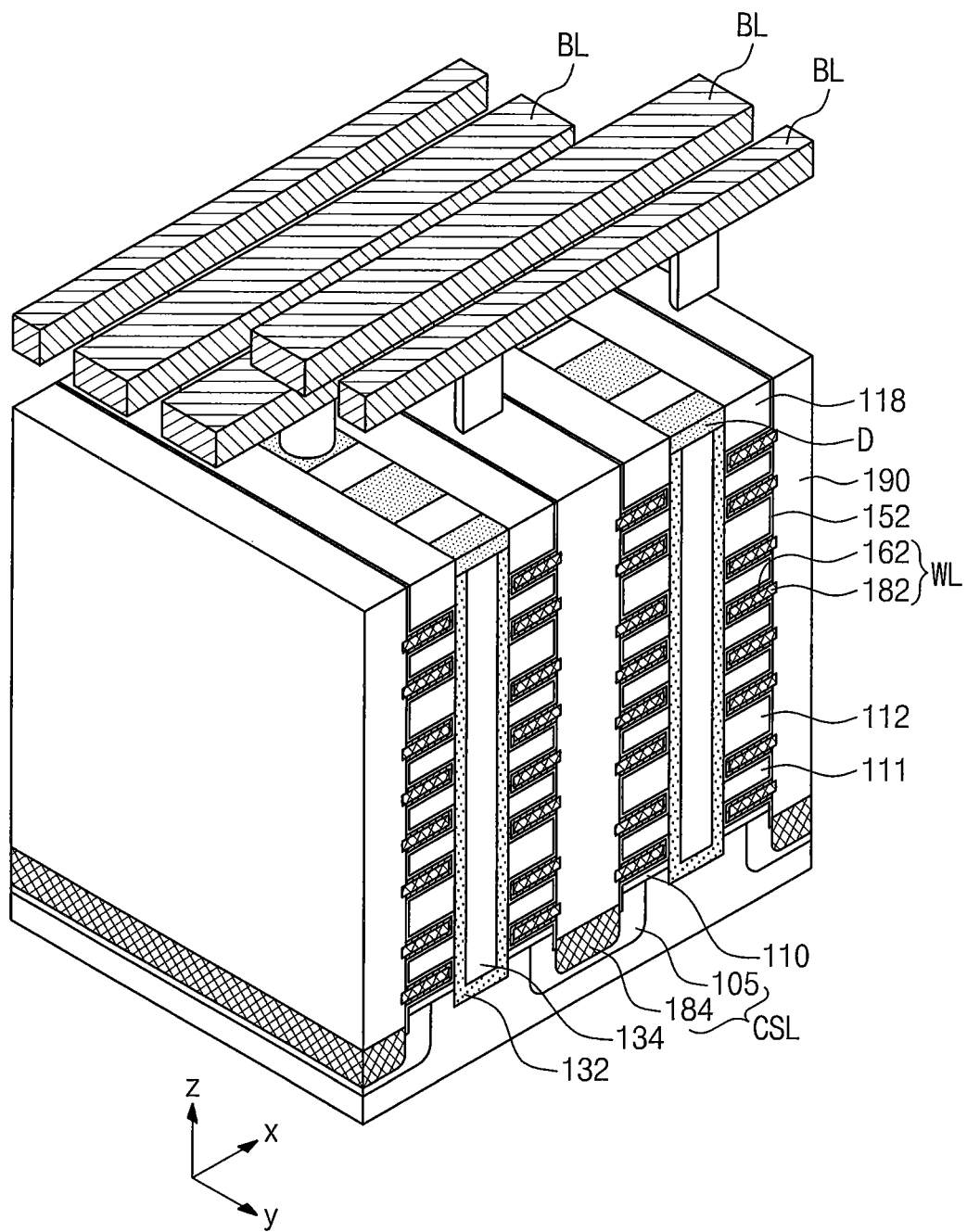
FIGS. 16 and 17 are perspective views illustrating a three-dimensional semiconductor memory device according to some embodiments of the inventive concept.
Figure 17:
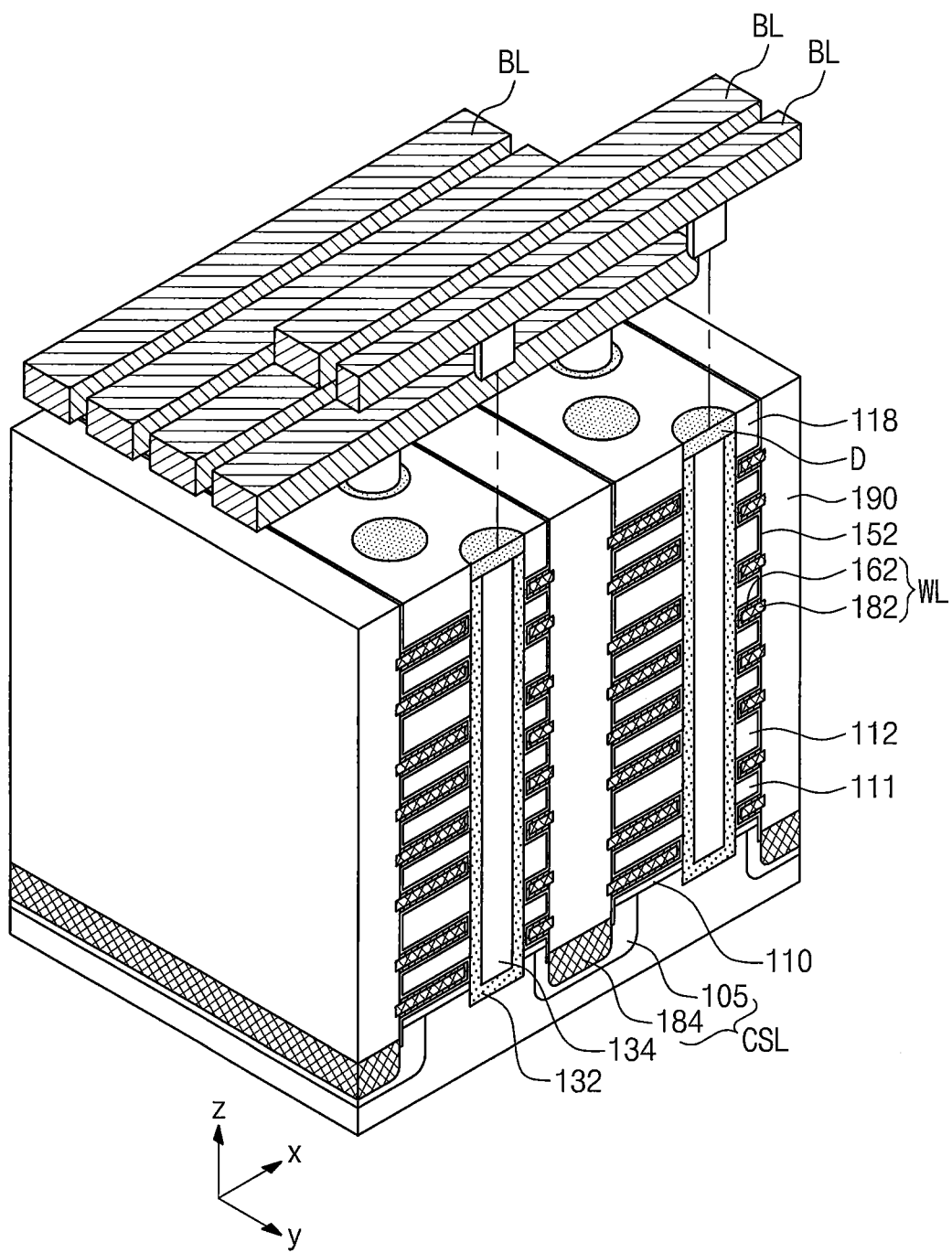

According to some embodiments, each of the openings 131, as shown in FIG. 2, may be formed with a cylindrical or rectangular hole shape and may be two-dimensionally and regularly formed on an xy plane. That is, the openings 131 are spaced from each other at an x-axis and a y-axis. According to further embodiments, in relation to a horizontal shape, the openings 131 may be a line-shaped trench extending in a y-axis direction. The line-shaped openings 131 may be formed parallel to each other. According to still further embodiments, as shown in FIG. 16, the openings 131 may be disposed in zigzags in a y-axis direction. Moreover, a separation distance between the adjacent openings 131 in one direction may be less than or equal to the width of the opening. Thus, if the openings 131 are disposed in a zigzag form, a large number of the openings 131 may be disposed in a predetermined area.

Figure 9:
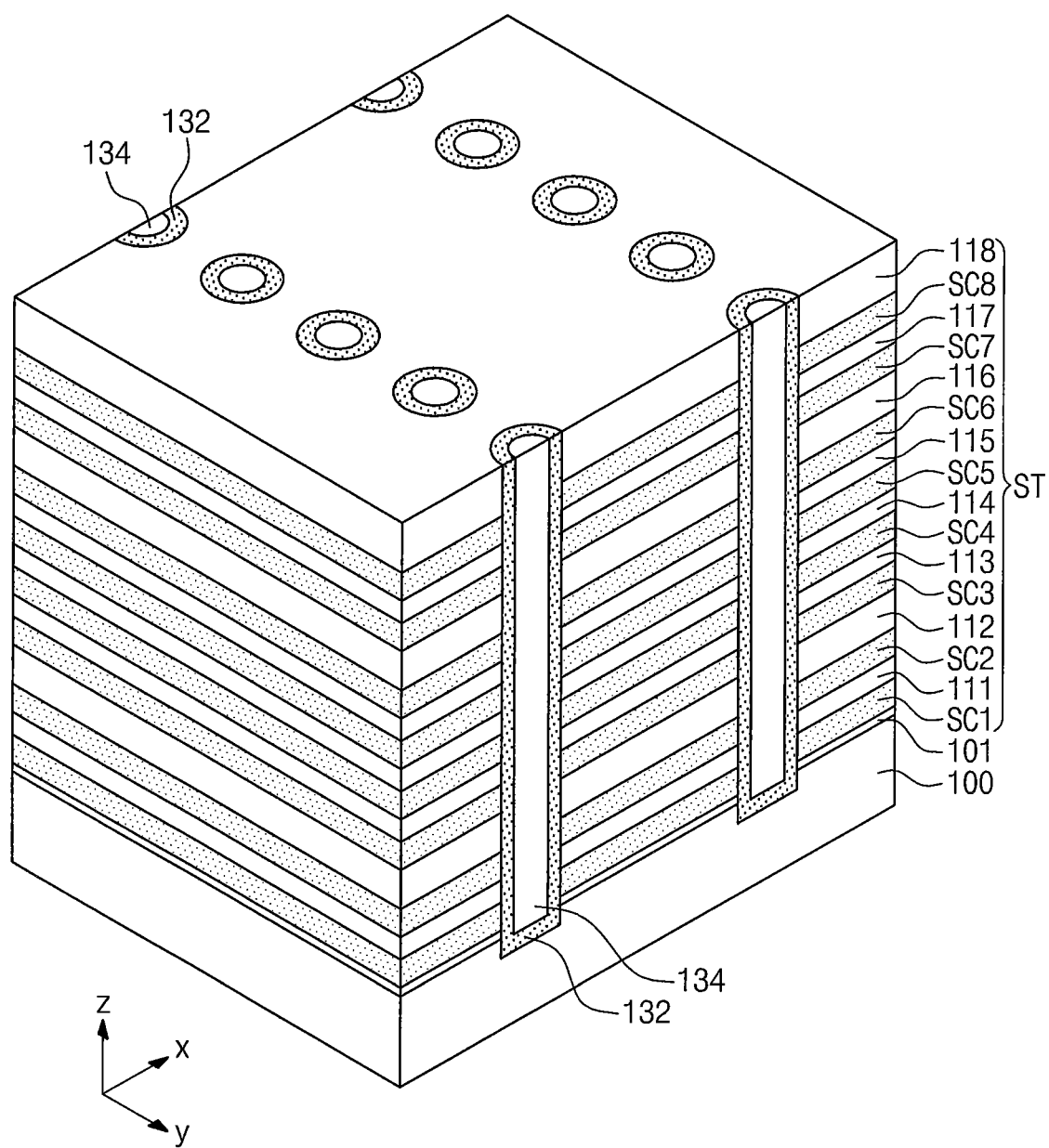

Referring now to FIG. 9, a semiconductor pattern 132 is formed in the openings 131. In particular, the semiconductor pattern 132 may be formed in an opening to directly contact the substrate 100 and may be substantially vertical to the substrate 100. The semiconductor pattern 132 may include silicon (Si), germanium (Ge), or combinations thereof and the semiconductor pattern 132 may be a semiconductor doped with an impurity or an un-doped intrinsic semiconductor. Moreover, a horizontal semiconductor layer may have a crystalline structure including at least one of single crystalline, amorphous, and polycrystalline.

The semiconductor pattern 132 may be formed in the openings 131 using a chemical vapor deposition technique or an atomic layer deposition technique. Moreover, if the semiconductor pattern 132 is formed using a deposition technique, due to a crystalline structure difference, discontinuous boundaries may be formed between the semiconductor pattern 132 and the substrate 100. Additionally, according to some embodiments, the semiconductor pattern 132 may be formed of single crystalline silicon by phase-shifting amorphous silicon or polycrystalline silicon through a thermal treatment process such as laser annealing after depositions of amorphous silicon or polycrystalline silicon. Additionally, according to further embodiments, a semiconductor pattern 132 may be formed in the openings 131 through an epitaxial process using the substrate 100 exposed by the openings 131 as a seed layer.

Additionally, the semiconductor pattern 132 may be deposited with less than the half of the width of the opening 131. In these embodiments, the semiconductor pattern 132 may fill a portion of the opening 131 and define an empty region at the center portion of the opening. Additionally, a thickness of the semiconductor pattern 132 (i.e., a thickness of a cell) may be thinner than a width of a depletion region to be generated in a semiconductor layer during an operation of a semiconductor memory device or less than an average length of silicon grains constituting a polycrystalline silicon. That is, the semiconductor pattern 132 may be formed with a pipe-shape, a hollow cylindrical shape, or a cup shape in the openings 131. Moreover, a buried insulation pattern 134 may be filled in an empty region defined by the semiconductor pattern 132. The buried insulation pattern 134 may be formed of an insulation material of an excellent gap-fill characteristic. For example, the buried insulation pattern 134 may be formed of a high density plasma oxide layer, a Spin On Glass (SOG) layer and/or a Chemical Vapor Deposition (CVD) oxide layer.

Additionally, the semiconductor pattern 132 may be completely filled in the cylindrical opening 131 to have a cylindrical shape through a deposition process. In these embodiments, after the depositing of the semiconductor pattern 132, a planarization process may be performed on the semiconductor pattern 132.

Moreover, if the openings 131 have a line shape, as shown in FIG. 16, semiconductor patterns 132 may be formed in the openings 131 by interposing the insulation patterns 111 to 118 between the openings 131. The forming of the semiconductor pattern 132 includes sequentially forming a semiconductor layer and a buried insulation layer in the openings 131 and patterning the semiconductor layer and the buried insulation layer to form a semiconductor pattern 132 having a rectangular plane in the opening 131. Moreover, the semiconductor pattern 132 may have a U-shape.

Figure 10:
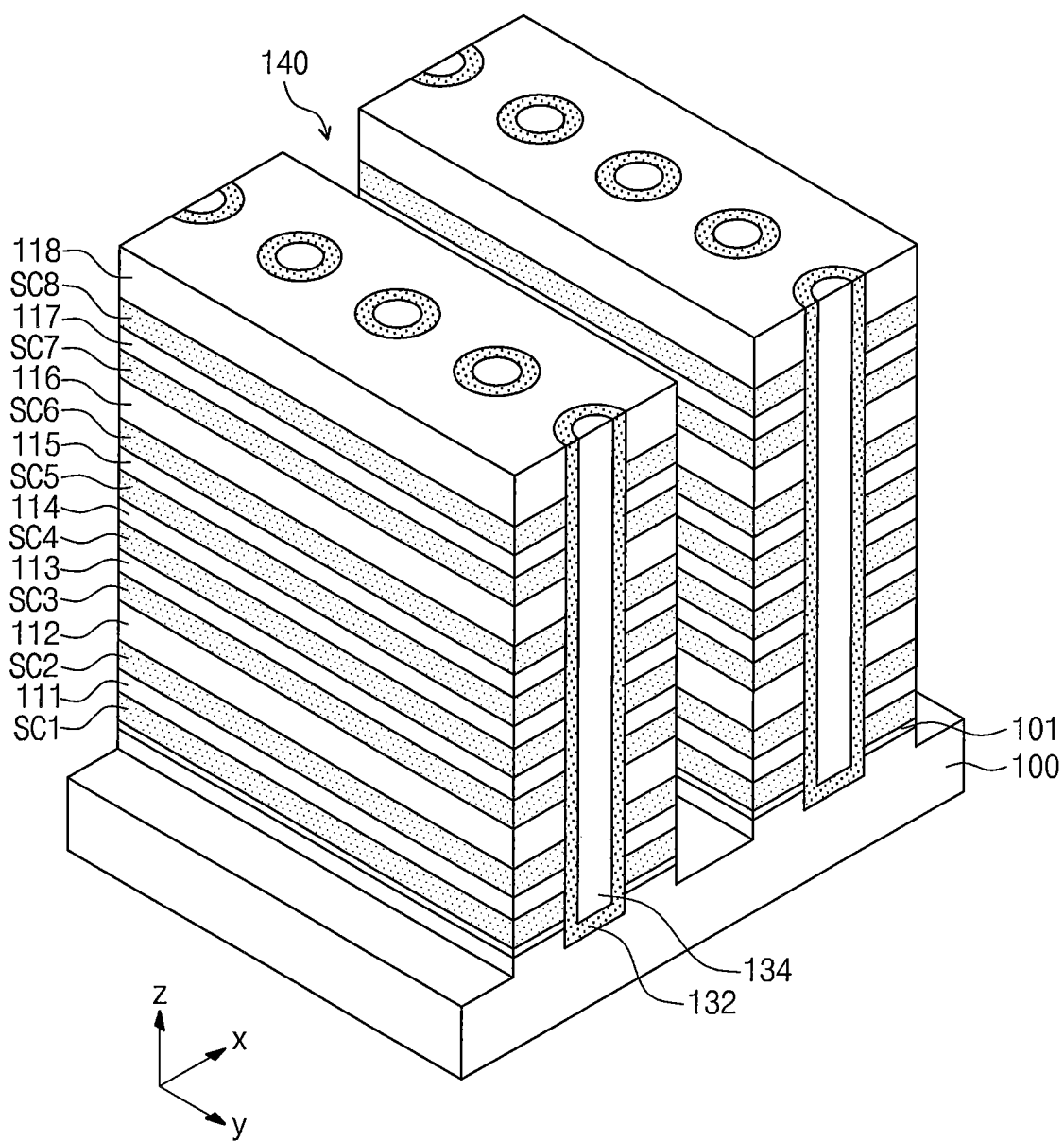

Referring now to FIG. 10, after the forming of the semiconductor patterns 132, trenches 140 exposing the substrate 100 between the adjacent semiconductor patterns 132 may be formed. In particular, the forming of the trenches 140 includes forming a mask pattern (not shown) defining planar positions of the trenches 140 on a thin film structure ST and unisotropically etching the thin film structure ST using the mask pattern as an etching mask.

The trench 140 may be formed to expose the sidewalls of the sacrificial layers SC1 and SC8 and the insulation layers 111 to 118, being space from the semiconductor patterns 132. In relation to a horizontal shape, the trench 140 may have a line shape or a rectangular shape and in relation to a vertical depth, the trench 140 may be formed to expose the top surface of the substrate 100. Additionally, the trench may have varying widths according to a distance from the substrate 100 according to an unisotropic etching process. Additionally, during the forming of the trenches 140, a top surface of the substrate 100, which is exposed to the trench 140 through over etch may be recessed with a predetermined depth.

As the trenches 140 are formed, a thin film structure may have a line shape extending in a y-axis direction. Moreover, in a thin film structure of one line shape, a plurality of semiconductor patterns 132 arranged in a y-axis direction may penetrate. Thus, a thin film structure having a line shape by the trenches 140 may have an inner sidewall adjacent to the semiconductor pattern 132 and an outer sidewall exposed to the trench 140. That is, the alternately and repeatedly stacked sacrificial pattern SC1 to SC8 and insulation patterns 111 to 118 may be formed on the substrate 100.

Moreover, according to some embodiments, after the forming of the trenches 140, an impurity region 105 may be formed in the substrate 100. The impurity region 105 may be formed through an ion implantation process using a thin films structure having a trench 140 as an ion mask. Moreover, the impurity region 105 may overlap a portion of a lower region of the thin film structure by impurity diffusion. Additionally, the impurity region 105 may have an opposite conductive type than the substrate 100.

Figure 11:
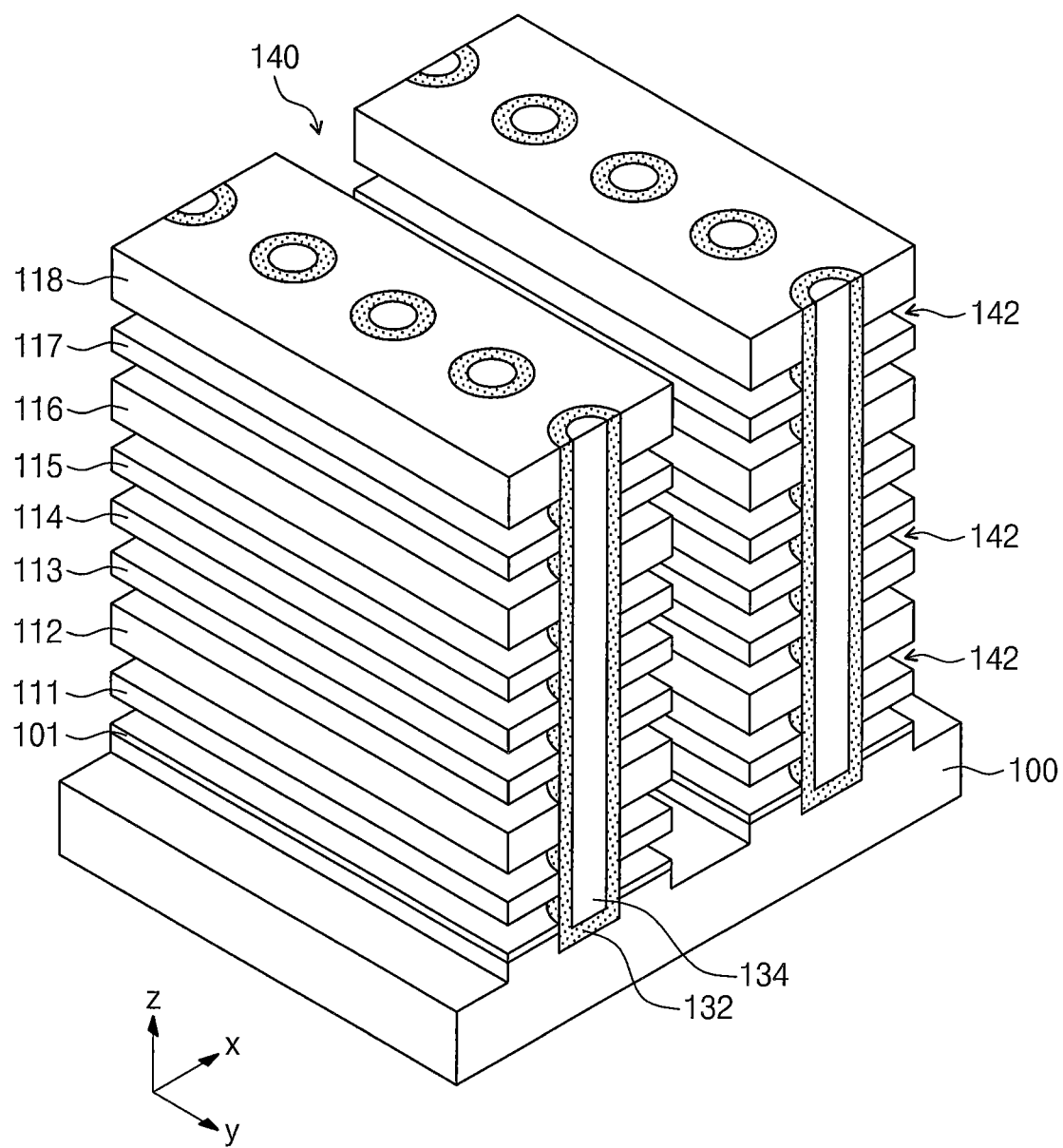

Referring now to FIG. 11, recess regions 142 are formed between the insulation patterns 111 to 118 by removing the sacrificial patterns SC1 to SC8 exposed to the trenches 150. The recess regions 142 may be formed by removing the sacrificial patterns SC1 to SC8 between the insulation patterns 111 to 118. That is, the recess regions 142 may horizontally extend from the trench 140 to between the insulation patterns 111 to 118 and may expose portions of the sidewall of the semiconductor pattern 132. Moreover, the recess region 142 at the lowermost may be defined by a buffer insulation layer 101. A vertical thickness (i.e., a length in a z-axis direction) of the recess region 142 may be defined by a deposition thickness of the sacrificial layers SC1 to SC8 when the sacrificial layers SC1 to SC8 are deposited in FIG. 2.

More specifically, the forming of the recess regions 142 may include isotropically etching the sacrificial patterns SC1 to SC8 using an etch recipe having an etch selectivity with respect to the insulation patterns 111 to 118. Here, the sacrificial patterns SC1 to SC8 may be completely removed by an isotropic etching process. For example, if the sacrificial patterns SC1 to SC8 are formed of a silicon nitride layer and the insulation patterns 111 to 118 are formed of a silicon oxide layer, the etching process may be performed using an etchant including phosphoric acid.

Figure 12:
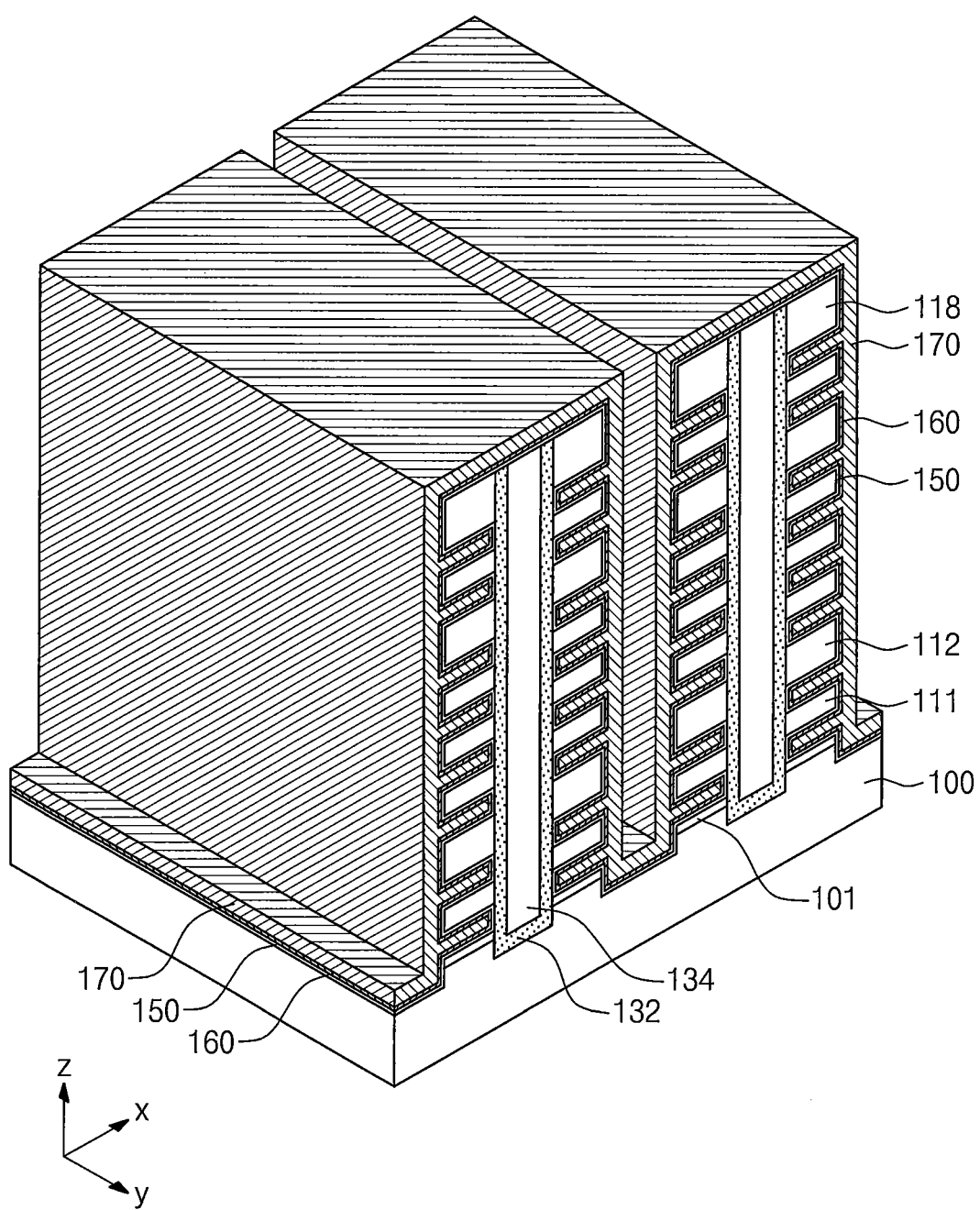

Referring to now to FIG. 12, a data storage layer 150 is formed in the recess regions 142. The data storage layer 150 may be formed to substantially and conformally cover a thin film structure having the recess regions 142. The data storage layer 150 may be formed through a deposition technique providing an excellent step coverage (e.g., a CVD or ALD technique). Moreover, the data storage layer 150 may be formed with a thinner thickness than the half of that of the recess region 142. That is, the data storage layer 150 may be formed on the sidewalls of the semiconductor pattern 132 exposed to the recess regions 142 and the data storage layer 150 may extend on bottom surfaces and top surfaces of the insulation patterns 111 to 118 defining the recess region 142. Additionally, the data storage layer 150 formed through a deposition process may be formed on a surface of the exposed substrate 100 between line-shaped thin film structures and a top surface of the uppermost insulation pattern 118 and may cover sidewalls of the insulation patterns 111 to 118. Moreover, the data storage layer 150 may cover a top surface of the substrate 100 (or the buffer insulation layer 101) exposed by the lowermost recess region 142. That is, as shown in FIGS. 15A through 15C, the data storage layer 152 may be conformally formed on a surface of a thin film structure having the recess regions 142.

Figure 15A:
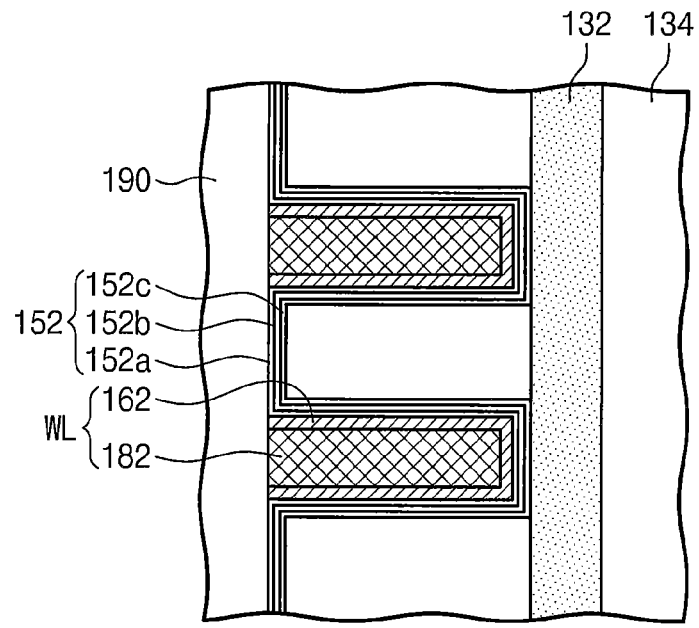
FIGS. 15A through 15C are diagrams illustrating portions of FIG. 14 in accordance with some embodiments of the present inventive concept.
Figure 15B:
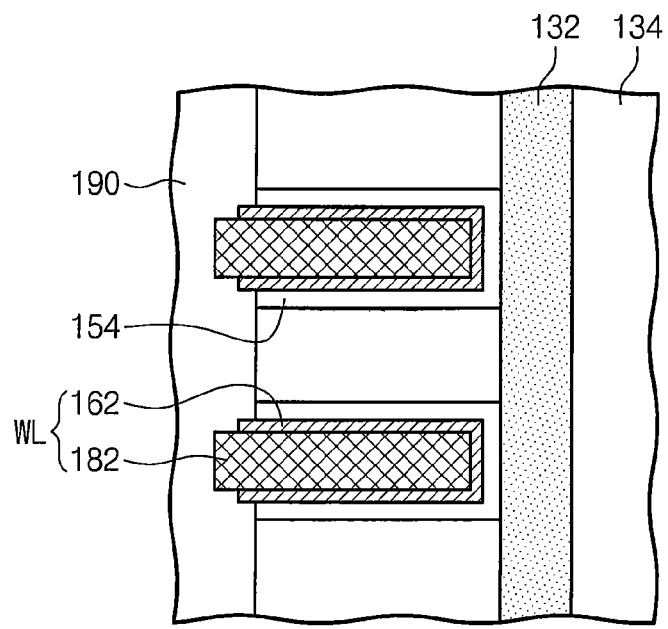

According to further embodiments, as shown in FIG. 15B, an data storage pattern 154 is locally formed between vertically adjacent insulation patterns 111 to 118 so that it may be separated from other vertically adjacent data storage patterns 154. When the data storage patterns 154 are vertically separated from each other, charges trapped in the data storage pattern 154 may be prevented from spreading into adjacent other data storage patterns 154. When the data storage pattern 154 is locally formed between vertically adjacent insulation patterns 111 to 118, the lowermost data storage pattern 154 may directly contact a top surface of the buffer insulation layer 101 (or the substrate 100).

According to some embodiments, the data storage layer 150 may be a charge storage layer. For example, the charge storage layer may be one of a charge trap insulation layer and an insulation layer including a floating gate electrode or conductive nano dots. Moreover, if the data storage layer 150 is a charge storage layer, data stored in the data storage layer 150 may be changed by F-N tunneling caused by a voltage difference between the semiconductor pattern 142 and the gate electrodes WL of FIG. 10. Moreover, the data storage layer 150 may be thin film, for example, a thin layer for a phase shift memory or a thin layer for a variable resistance memory, which may store data based on another operation principle.

Figure 15C:
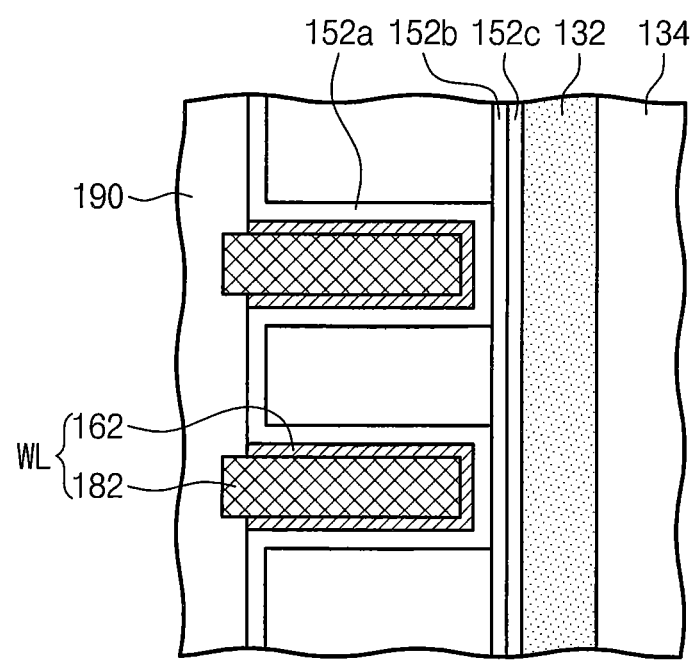

According to some embodiments, as shown in FIGS. 15A and 15C, the data storage layer 150 may include a sequentially-stacked blocking insulation layer 152a, charge trap layer 152b, and a tunnel insulation layer 152c. The blocking insulation layer 152a may include at least one of a silicon oxide layer, a silicon nitride layer, a silicon oxide nitride layer, and dielectric layers and may include a plurality of layers. At this point, the dielectric layers mean insulation materials having a high dielectric constant than a silicon oxide layer and may include tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a BST layer, and a PZT layer. The tunnel insulation layer 152c may be formed of a material having a lower dielectric constant than the blocking insulation layer 152a and for example, may include at least one of an oxide, a nitride, or an oxide nitride. The charge trap layer 152b may be an insulation thin layer (e.g., a silicon nitride layer) with rich charge trap sites or an insulation thin layer with conductive grains. According to some embodiments, the tunnel insulation layer 152c may be a silicon oxide layer, the charge trap layer 152b may be a silicon nitride layer, and the blocking insulation layer 152a may be an aluminum oxide layer.

Moreover, according to further embodiments, the blocking insulation layer 152a may include a first blocking insulation layer and a second blocking insulation layer. Here, the first and second blocking insulation layers may be formed of respectively different materials and one of the first and second blocking insulation layers may be formed of one of materials having a smaller band gap than a tunnel insulation layer and having a larger band gap than a charge trap layer. For example, the first blocking insulation layer may be one of high dielectric layers such as an aluminum oxide layer and a hafnium oxide layer and the second blocking insulation layer may be formed of a material having a smaller dielectric constant than the first blocking insulation layer. According to further embodiments, the second blocking insulation layer is one of high dielectric layers and the first blocking insulation layer may be formed of a material having a smaller dielectric constant than the second blocking insulation layer.

According to still further embodiments, in the data storage layer 150 where the sequentially-stacked blocking insulation layer 152a, charge trap layer 152b, and tunnel insulation layer 152c, the tunnel insulation layer 152c and the charge trap layer 152b may be formed crossing over an inner wall of a thin film structure adjacent to the semiconductor pattern 132 as shown in FIG. 15C. That is, the tunnel insulation layer 152c and the charge trap layer 152b may be formed first on an inner wall of an opening before the semiconductor pattern 132 is formed. Then, the blocking insulation layer 152a may be conformally formed in a recess region 142 that is formed before. Accordingly, the blocking insulation layer 152a may directly contact a top surface and a bottom surface of an insulation pattern. Moreover, after the forming of the recess regions 142, the charge trap layer 152b and the blocking insulation layer 152a may be conformally formed in the recess region 142.

Figure 13:
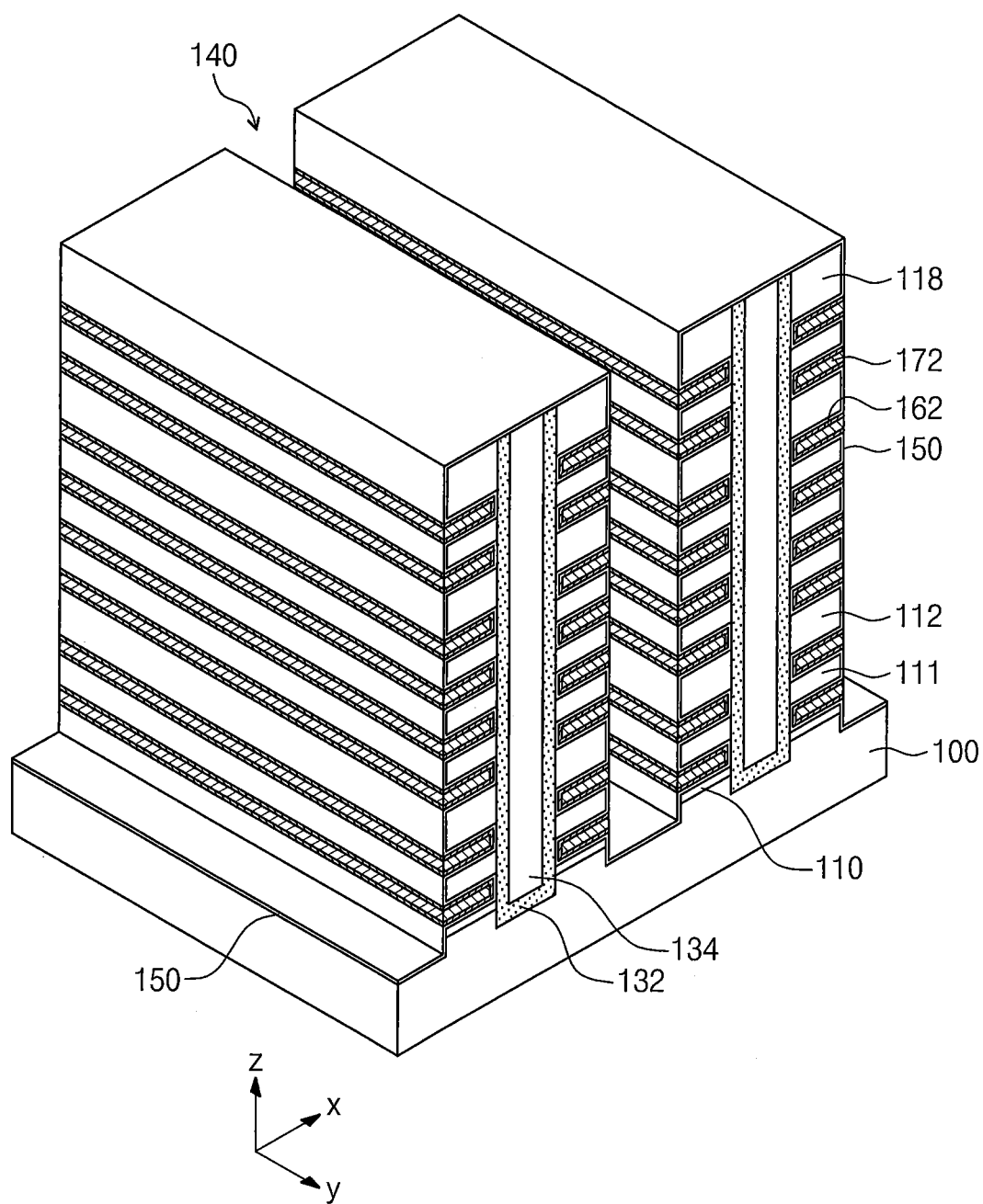

Next, referring to FIGS. 12 and 13, gate electrodes WL are formed in the respective recess regions 142 having the data storage layer 150. Additionally, the gate electrodes WL are formed, a common source conductive line (CSL) is formed in the substrate 100 simultaneously.

As the gate electrode WL is formed in the recess region 142 where the data storage layer 150 is conformally formed, a vertical thickness of the gate electrode WL may be reduced more than that of the recess region 142. This thickness reduction of the gate electrodes WL may increase resistance of the gate electrode WL. Therefore, in order to improve the integration degree and electrical characteristics of a three-dimensional semiconductor memory device, it is required to reduce the resistivity of a material constituting the gate electrode WL.

According to some embodiments, the gate electrodes WL and the common source conductive lines CSL may be formed of a metal material (e.g., tungsten) having a low resistivity. Moreover, the common source line CSL may be an impurity region 105 in the substrate 100. However, if the common source line CSL is an impurity region in the substrate 100, it is difficult to maintain resistance and may increase the resistance of the common source line CSL.

In further embodiments, the common source line CSL may include an impurity region 105 in the substrate 100 and a common source silicide layer 184. The common source conductive line CSL including metal silicide may have lower resistance than that including an impurity region 105. Additionally, according to embodiments, the common source silicide layer 184 constituting the common source conductive line CSL and a gate silicide layer 182 constituting a stacked gate electrode WL on the substrate 100 may be simultaneously formed.

Referring now to FIGS. 12 and 13, methods of forming gate electrodes WL and a common source line CSL will be discussed. The forming of the gate electrodes WL includes forming a gate conductive layer 170 in recess regions having a data storage layer 150 and a trench and forming vertically separated gate electrodes WL by removing the gate conductive layer 170 in the trench.

The gate conductive layer 170 may be formed through a deposition technique providing an excellent step coverage, for example, a CVD or ALD technique. Accordingly, the gate conductive layer 170 is filled in recess regions and is conformally formed in a trench. In particular, the gate conductive layer 170 may be deposited with a thicker thickness than the half of that of a recess region. Moreover, if a planar width of a trench is greater than that of a recess region, the gate conductive layer 170 may fill a portion of the trench and may define an empty region at the center of the trench. At this point, the empty region may be opened upwardly.

The gate conductive layer 170 may include at least one of doped poly silicon, tungsten, metal nitride layers, and metal silicides. According to some embodiments, the forming of the gate conductive layer 170 includes sequentially forming a barrier metal layer (e.g., a metal nitride) and a metal layer (e.g., tungsten). Moreover, the technical scopes of the inventive concept are not limitedly applied to a flash memory device and thus the gate conductive layer 170 may vary in terms of a material and a structure. Then, vertically separated gate electrodes WL are formed by isotropically etching the gate conductive layer 170 filled in the trench.

In particular, the removing of the gate conductive layer 170 from the trench may include unisotropically etching the gate conductive layer 170 using the uppermost insulation layer constituting a thin film structure ST as an etching mask or a hard mask pattern (not shown) formed additionally on the uppermost insulation layer as an etching mask. During the unisotropically etching of the gate conductive layer 170, the data storage layer 150 contacting a top surface of the substrate 100 may serve as an etch stop layer.

According to some embodiments, in order to form vertically separated gate electrodes WL, a trench that exposes the data storage layer 150 covering a top surface of the substrate 100 may be formed. Unlike this, a top surface of the substrate 100 may be exposed to a trench as a gate conductive layer 170 is unisotropically etched and as shown in the drawings, a top surface of the substrate 100 may be recessed.

According to further embodiments, the gate electrodes WL may be formed by performing an isotropic etching process on the gate conductive layer 170 having an empty region. The isotropic etching process may be performed until the gate electrodes WL are separated from each other. That is, sidewalls of the insulation layers and the data storage layer 150 on a top surface of the substrate 100 may be exposed through the isotropic etching process. Here, as an isotropic etching process is performed through the empty region, the gate conductive layer 170 at the sidewall and bottom of the empty region may be substantially and simultaneously etched. As the isotropic etching process is performed through the empty region, the gate conductive layer 170 on the thin film structure ST and on the substrate 100 may be uniformly etched. Accordingly, horizontal thicknesses of the gate electrodes WL may be uniform. Moreover, according to a process time during the isotropic etching process, horizontal thickness of the gate electrodes WL may vary. For example, the gate electrodes WL may be formed to fill a portion of the recess region. Each of the gate electrodes WL may include a metal pattern 163a and a barrier metal pattern 162 interposed between the metal pattern 182 and the data storage layer 152, as shown in FIGS. 15A through 15C.

According to some embodiments, the gate electrodes WL formed locally in the respective recess regions may constitute a gate structure. That is, the gate structure may be formed between respectively adjacent trenches. Like this, as trenches are formed, the gate structure according to some embodiments may have a line shape extending in one direction. Moreover, a plurality of semiconductor patterns 132 arranged in one direction may penetrate in one gate structure. Moreover, the gate electrodes WL may have outer walls adjacent to a trench and inner sidewalls adjacent to the semiconductor pattern 132. The inner sidewalls of the gate electrodes WL may surround the semiconductor pattern 132 or may cross over one sidewall of the semiconductor pattern 132. Unlike this, the gate electrodes WL in one block are connected to each other in a word line contact region WCTR and thus may have a comb shape or a finger shape.

According to this embodiment, the stacked gate electrodes WL may serve as the string selection line SSL, the ground selection line GSL, and the word lines WL described with reference to FIG. 2. For example, the uppermost layer and the lowermost layer of the gate electrodes WL serve as the string selection line SSL and the ground selection line GSL, respectively and the gate electrodes WL therebetween may serve the word lines WL.

Or, as described with reference to FIG. 3, the gate electrodes WL of two layers at the uppermost may serve as the string selection line SSL of FIG. 2 and the gate electrodes WL of two layers at the lowermost may serve as the ground selection line GSL of FIG. 2. The gate electrodes WL serving as the string selection line SSL of FIG. 2 or the ground selection line GSL of FIG. 2 may be horizontally separated and in these embodiments, the electrically separated string selection lines SSL of FIG. 2 or the ground selection lines GSL of FIG. 2 may be disposed at the same height.

Moreover, after the forming of the gate structure, as shown in FIG. 15A, a process for selectively removing the data storage layer 150 formed on the sidewalls of the insulation patterns 111 to 118 and the surface of the substrate 100 may be further performed. The removing of the data storage layer 150 may use an etch gas or an etchant having an etch selectivity with respect to the gate conductive layer 170. For example, when the data storage layer 150 on the sidewalls of the insulation layers is removed through an isotropic etching process, an etchant such as HF, O3/HF, phosphoric acid, sulfuric acid, and LAL may be used. Additionally, in order to remove the data storage layer 150, a fluoride based etchant, phosphoric acid, and sulfuric acid may be sequentially used.

Figure 14:
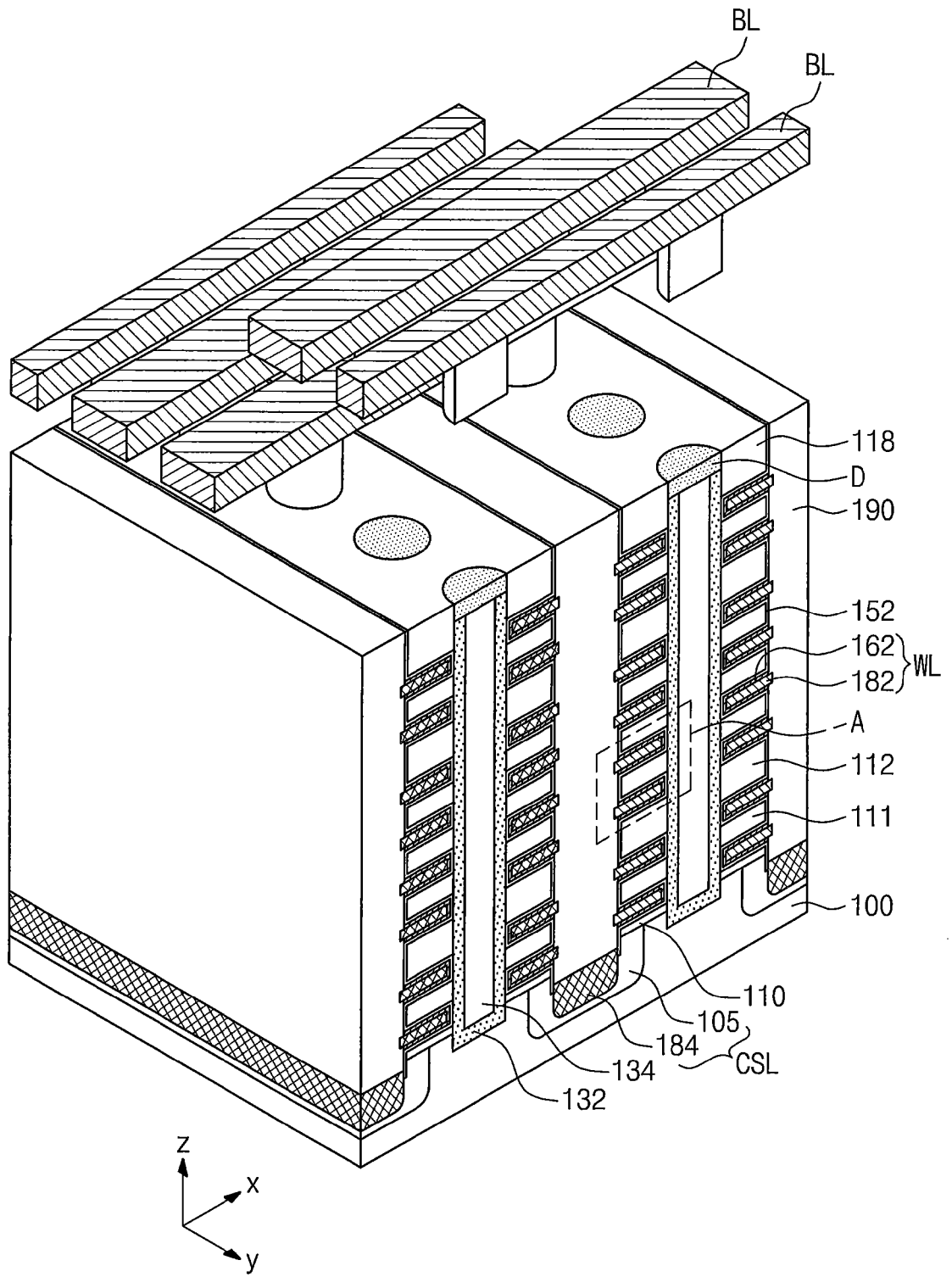

Referring to FIG. 14, after the forming of the gate electrodes WL, impurity regions 105 serving as a common source line may be formed by ion-implanting an impurity into the substrate 100 between the gate electrodes WL. In particular, the impurity regions 105 may be formed through an ion implantation process using the gate structures on the substrate 100 as an ion implantation mask. Accordingly, the impurity region 105 may have a line shape extending in one direction like a horizontal shape of the trench. Moreover, the impurity region 105 may overlap a portion of the lower region of the gate structure due to the diffusion of ah impurity. Additionally, the impurity region may have an opposite conductive type than the substrate 100.

Moreover, during the forming of the impurity region 105, an data storage layer 150 on the bottom surface of the trench 140 may serve as an ion implantation buffer layer. According to further embodiments, the impurity region 105, as described with reference to FIG. 10, may be formed in the substrate 100 below the trench 140 after the forming of the trench 140.

Additionally, according to some embodiments, a silicidation process for forming a metal silicide prepared by the reaction of the impurity region 105 in the substrate 100 with a metal layer 180 may be performed.

Next, referring to FIG. 14, a gate separation insulation pattern 190 may be formed in the trench 140. The forming of the gate separation insulation pattern 190 includes filling the trenches 140 having a non-reactive metal layer removed with at least one of insulation materials. According to some embodiments, the gate separation insulation pattern 190 may be at least one of a silicon oxide layer, a silicon nitride layer, and a silicon oxide nitride layer. Moreover, according to further embodiments, before the forming of the gate separation insulation pattern 190 in the trenches 140, a capping layer may be formed to prevent the oxidation of gate and common source silicide layers 182 and 184. The capping layer may be formed of an insulation nitride and for example may be formed of a silicon nitride layer.

After the forming of the gate separation insulation pattern 190, a drain region D may be formed by implanting an impurity, which has an opposite conductive type than the semiconductor pattern 132, into an upper portion of the semiconductor pattern 132. Unlike this, the drain region D may be formed on the semiconductor pattern 132 before the forming of the trenches 140 described in FIG. 10.

Next, bit lines connecting the semiconductor patterns 132 electrically may be formed on the gate electrodes WL. The bit lines BL may be formed along a direction crossing over the gate electrodes WL having a line shape as shown in the drawings. Moreover, the bit lines BL may be connected to the drain region D on the semiconductor patterns 132 by a contact plug.

Figure 18:
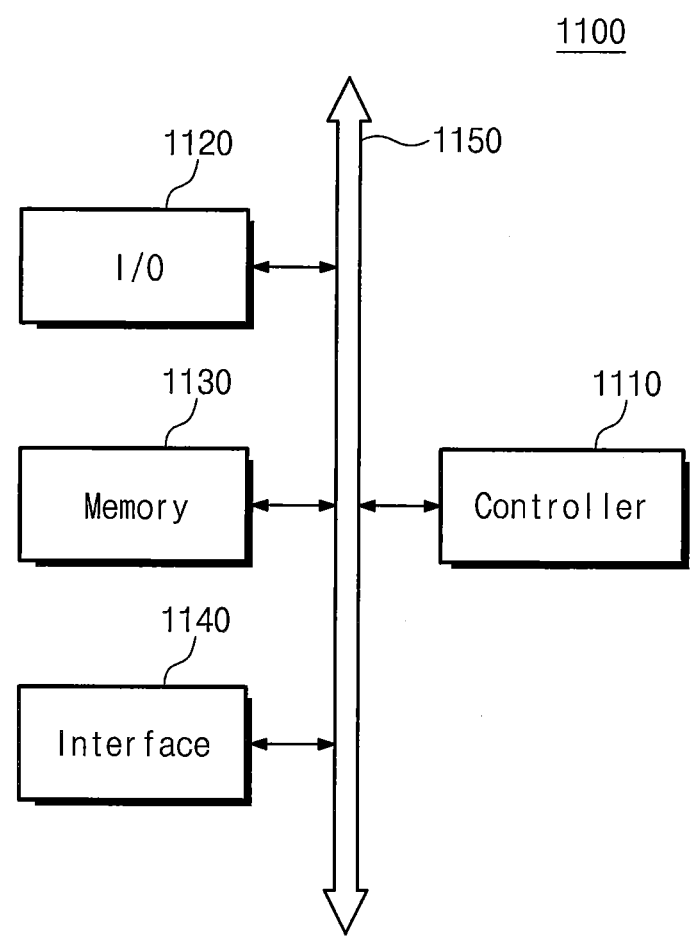
FIG. 18 is a schematic block diagram illustrating examples of a memory system including a semiconductor memory device in accordance with some embodiments of the present inventive concept.

FIG. 18 is a schematic block diagram illustrating a memory system including a semiconductor memory device manufactured according to manufacturing methods of some embodiments of the inventive concept. Referring to FIG. 18, the memory system 1100 may be applied to a PDA, a portable computer, a web tablet, a wireless phone, a mobile phone, a digital music player, a memory card, or all devices for transmitting and receiving information via a wireless environment.

The memory system 1100 includes a controller 1110, an input/output device (or I/O) 1120 such as a keypad, a keyboard, and a display, a memory device 1130, an interface 1140, and a bus 1150. The memory 1130 is mutually communicated with the interface 1140 through the bus 1150.

The controller 1110 may include at least one micro processor, digital signal processor, micro controller, or other processors similar thereto. The memory 1130 may be used for storing commands executed by a controller. The input/output device 1120 may receive data or signal from the external of the system 1100 or outputs data or signal to the external of the system 1100. For example, the input/output device 1120 may include a keyboard, a keypad, or a display device.

The memory 1130 includes a nonvolatile memory device according to embodiments of the inventive concept. The memory 1130 may further include other kinds of memories, an arbitrarily random accessible volatile memory, and other various kinds of memories. The interface 1140 serves to transmit data to a communication network or receive data from a communication network.

Figure 19:
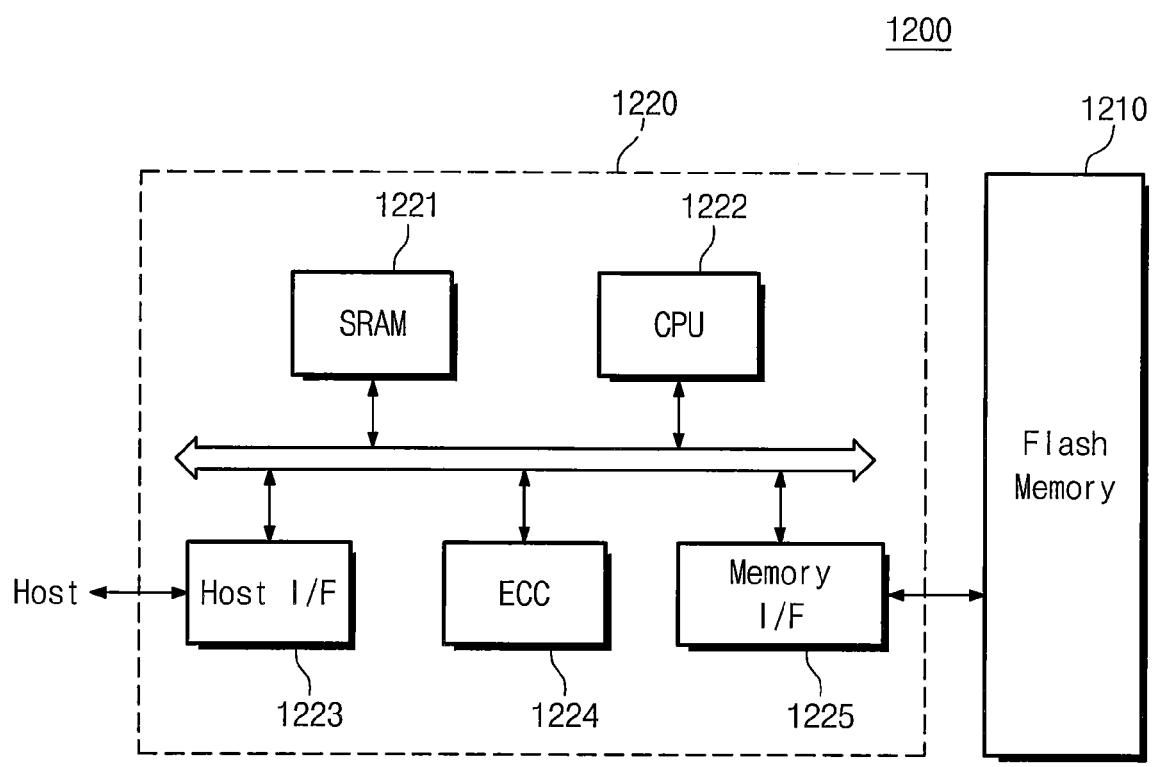
FIG. 19 is a schematic block diagram illustrating examples of a memory card including a semiconductor memory device in accordance with some embodiments of the present inventive concept.

FIG. 19 is a schematic block diagram illustrating memory cards including a semiconductor memory device manufactured according to some embodiments of the inventive concept. Referring to FIG. 19, the memory card 1200 for supporting a data storage capacity of a large amount includes a flash memory device 1210 according to the inventive concept. The memory card 1200 includes a memory controller 1220 for controlling general data exchange between the host and the flash memory device 1210.

A SRAM 1221 serves as an operating memory of a central processing unit (CPU) 1222. The host interface 1223 includes a data exchange protocol of a host connected to the memory card 1200. An error correction code block (ECC) 1224 detects and corrects errors in data read from the flash memory device 1210. A memory interface 1225 interfaces with the flash memory device 1210 of the inventive concept. The CPU 1222 performs general control operations for data exchanges of the memory controller 1220. Although not shown in the drawings, it is apparent to those skilled in the art that the memory card 1200 may further include a ROM (not shown) for storing code data for interfacing with a host.

Figure 20:
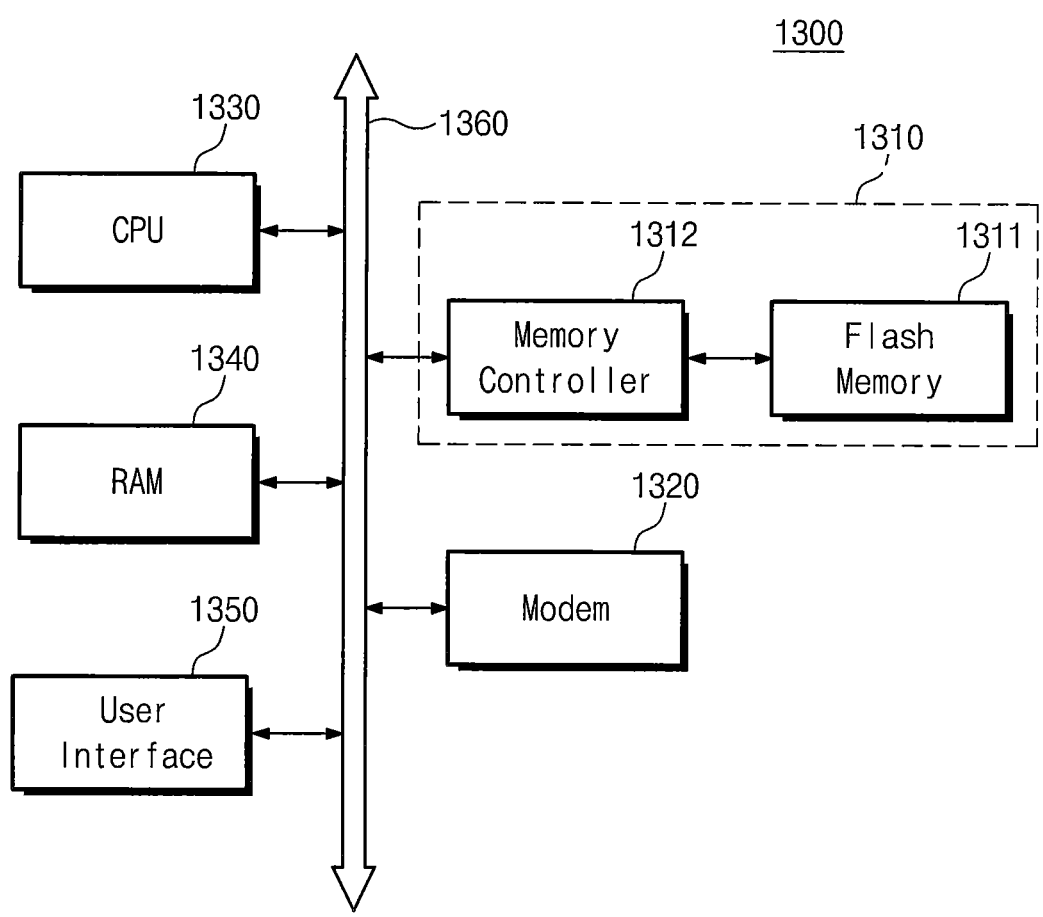
FIG. 20 is a schematic block diagram illustrating examples of an information processing system mounting a semiconductor memory device in accordance with some embodiments of the present inventive concept.

FIG. 20 is a schematic block diagram illustrating information processing systems mounting a semiconductor memory device according to some embodiments of the present inventive concept. Referring to FIG. 20, a memory system 1310 of the inventive concept is mounted on the information processing system such as a mobile device or a desktop computer. The information processing system 1300 includes a flash memory system 1310, a modem 1320, a CPU 1330, a RAM 1340, and a user interface 1350, which are electrically connected to a system bus 1360. The flash memory system 1310 may be substantially identical to the above mentioned memory system or flash memory system. The flash memory system 1310 stores data processed by the CPU 1330 or data inputted from the external. Here, the flash memory system 1310 may be configured as a semiconductor disk device (SSD) and in these embodiments, the information processing system 1300 may stably store a high capacity data in the flash memory system 1310. Moreover, as its reliability is increased, since the flash memory system 1310 can save resources consumed for correcting errors, a high-speed data exchange function can be provided to the information processing system 1300. Although not shown in the drawings, it is apparent to those skilled in the art that the information processing system 1300 may further include an application chipset, a camera image processor (CIS), and an input/output device.

A flash memory device or a memory system according to the above-mentioned embodiments may be mounted through various forms of semiconductor packages. For example, the flash memory device or the memory system may be packaged for mounting through Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to some embodiments of the inventive concept, stress applied to a substrate may be alleviated by adjusting stresses of first and second material layers constituting a thin film structure. Accordingly, cracks of first and second material layers may be prevented and a substrate warpage phenomenon may be reduced. Accordingly, process errors may be reduced during manufacturing processes of a tree-dimensional semiconductor device and furthermore, productivity of manufacturing processes for a three-dimensional semiconductor device may be improved.

According to embodiments of the inventive concept, oxide layer and sacrificial layers are alternately and repeatedly deposited in one chamber. Accordingly, forming of repeatedly and alternately stacked oxide and sacrificial layers may improve productivity.

Moreover, during the forming of the oxide layers and the sacrificial layers, since nitrous oxide is used as an oxygen source gas, particles occurring on a substrate may be minimized during the forming of the oxide layers and the sacrificial layers. Accordingly, a three-dimensional semiconductor device with improved reliability and electrical characteristics may be realized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a three-dimensional device, the method comprising:
- loading a substrate into a single chamber;
- alternately and repeatedly depositing oxide layers having a compressive stress and sacrificial layers having a tensil stress on the substrate in the chamber,
- wherein depositing the oxide layers comprises using a gas mixture including a silicon source gas and a nitrous oxide ($N_2O$); and
- unloading the substrate from the chamber.

2. The method of claim 1, wherein the gas mixture comprises a first gas mixture and wherein the alternately and repeatedly stacking of the oxide layers and the sacrificial layers comprises:
- depositing an oxide layer;
- performing a first purging process for purging the first gas mixture used for depositing the oxide layer;
- depositing a sacrificial layer; and
- performing a second purging process for purging a second gas mixture used for depositing the sacrificial layer;
- wherein the depositing of the oxide layer, the first purging process, the depositing of the sacrificial layer, and the second purging process are repeatedly performed in plurality.

3. The method of claim 2, wherein the sacrificial layers are silicon nitride layers and the oxide layers are silicon oxide layers.

4. The method of claim 3:
- wherein the sacrificial layers are deposited by the second gas mixture, the second gas mixture including silane and ammonia; and
- wherein the oxide layers are deposited by the first gas mixture, the first gas mixture including a Tetra-Ethyl-Ortho-Silicate (TEOS) and nitrous oxide.

5. The method of claim 4, wherein each of the first gas mixture and the second gas mixture further comprises carrier gas.

6. The method of claim 1, further comprising:
- forming semiconductor patterns that penetrate the oxide layers and the sacrificial layers;
- forming a trench in the alternately and repeatedly stacked sacrificial patterns and oxide patterns by patterning the oxide layers and the sacrificial layers, the semiconductor patterns penetrating the sacrificial patterns and the oxide layer patterns;
- forming empty regions between the oxide layer patterns by removing the sacrificial patterns;
- conformally forming a multilayer dielectric layer on inner surfaces of the empty region; and
- forming gate patterns that fill the empty regions.

7. The method of claim 6:
- wherein the alternately and repeatedly stacked gate patterns and oxide patterns are included in a gate structure; and
- wherein the plurality of semiconductor patterns penetrating the gate structure are arranged in one column in one direction.

8. The method of claim 6:
- wherein the alternately and repeatedly stacked gate patterns and oxide patterns are included in a gate structure; and
- wherein the plurality of semiconductor patterns penetrating the gate structure are arranged in a zigzag in one direction.

9. The method of claim 1:
- wherein the oxide layer applies a stress in a range of about $0.1 \times 10^9$ dyne/cm$^2$ to about $10 \times 10^9$ dyne/cm$^2$ to the substrate; and
- wherein the sacrificial layer applies a stress in a range of about $-0.1 \times 10^9$ dyne/cm$^2$ to about $-10 \times 10^9$ dyne/cm$^2$ to the substrate.

10. The method of claim 1, wherein the alternately and repeatedly deposited oxide layers having compressive stress and sacrificial layers having tensil stress provide a thin film structure configured to cancel out stress applied to the substrate.

11. The method of claim 10, wherein presence of the thin film structure reduces a degree of warpage of the substrate to less than about +/− 200 μm.

12. A method of manufacturing a three-dimensional device, the method comprising:
- loading a substrate into a single chamber;
- depositing an oxide layer having a compressive stress on the substrate in the chamber;
- depositing a sacrificial layer having a tensile stress on the device in the chamber;
- alternatively repeating depositing the oxide layers having the compressive stress and sacrificial layers having the tensile stress on the substrate in the chamber; and
- unloading the substrate from the chamber.

13. The method of claim 12:
- wherein depositing the oxide layer is followed by performing a first purging process for purging a first gas mixture used for depositing the oxide layer; and
- wherein depositing the sacrificial layer is followed by performing a second purging process for purging a second gas mixture used for depositing the sacrificial layer.

14. The method of claim 12, wherein the alternately and repeatedly deposited oxide layers having compressive stress and sacrificial layers having tensil stress provide a thin film structure configured to cancel out stress applied to the substrate.

15. The method of claim 14, wherein presence of the thin film structure reduces a degree of warpage of the substrate to less than about +/−200 μm.

16. The method of claim 12, wherein depositing the oxide layers comprises using a gas mixture including a silicon source gas and a nitrous oxide ($N_2O$).

17. A method of manufacturing a three-dimensional device, the method comprising:
- loading a substrate into a single chamber;
- alternately and repeatedly depositing oxide layers and sacrificial layers on the substrate in the chamber,
- wherein depositing the sacrificial layers comprises depositing first sacrificial layers having a compressive stress and depositing second sacrificial layers having a tensile stress; and
- unloading the substrate from the chamber.

18. The method of claim 17, wherein the number of the first sacrificial layers is the same as the number of the second sacrificial layers.

19. The method of claim 17, wherein the first and second sacrificial layers contain hydrogen and wherein a hydrogen content in the first sacrificial layers is different from a hydrogen content in the second sacrificial layers.

20. The method of claim 17, wherein the sacrificial layers are silicon nitride layers and the oxide layers are silicon oxide layers.

* * * * *